United States Patent
Uchino et al.

(10) Patent No.: US 11,512,958 B2
(45) Date of Patent: Nov. 29, 2022

(54) ANGULAR RATE SENSOR

(71) Applicant: Sumitomo Precision Products Co., Ltd., Amagasaki (JP)

(72) Inventors: Ryohei Uchino, Amagasaki (JP); Takashi Ikeda, Amagasaki (JP)

(73) Assignee: Sumitomo Precision Products Co., Ltd., Amagasaki (JP)

( * ) Notice: Subject to any disclaimer, the term of this patent is extended or adjusted under 35 U.S.C. 154(b) by 145 days.

(21) Appl. No.: 16/649,474

(22) PCT Filed: Sep. 18, 2018

(86) PCT No.: PCT/JP2018/034512
§ 371 (c)(1),
(2) Date: Mar. 20, 2020

(87) PCT Pub. No.: WO2019/059187
PCT Pub. Date: Mar. 28, 2019

(65) Prior Publication Data
US 2020/0300628 A1    Sep. 24, 2020

(30) Foreign Application Priority Data
Sep. 21, 2017 (JP) .............................. JP2017-181555

(51) Int. Cl.
*G01C 19/5684* (2012.01)
*B81B 3/00* (2006.01)
*G01C 19/5719* (2012.01)
*H01L 29/84* (2006.01)
*G01C 19/5677* (2012.01)

(52) U.S. Cl.
CPC ........ *G01C 19/5684* (2013.01); *B81B 3/0081* (2013.01); *G01C 19/5677* (2013.01); *G01C 19/5719* (2013.01); *H01L 29/84* (2013.01); *B81B 2201/0271* (2013.01)

(58) Field of Classification Search
CPC ............. G01C 19/567; G01C 19/5677; G01C 19/5684; G01C 19/5719
See application file for complete search history.

(56) References Cited

U.S. PATENT DOCUMENTS 5,932,804 A * 8/1999 Hopkin .............. G01C 19/5677
73/504.13
6,272,925 B1 * 8/2001 Watson ................ G01C 19/567
73/504.12
6,282,958 B1 * 9/2001 Fell ..................... G01C 19/5684
73/504.13

(Continued)

FOREIGN PATENT DOCUMENTS

JP    2010-043955     *  2/2010
JP    2010-210605 A      9/2010
JP    2013-539858 A     10/2013

*Primary Examiner* — Helen C Kwok
(74) *Attorney, Agent, or Firm* — Crowell & Moring LLP

(57) ABSTRACT

An angular rate sensor includes an annular resonator. The resonator includes an annular base material made of a first material, and an annular first low thermal conductor made of a second material having a lower thermal conductivity than the first material, the first low thermal conductor being sandwiched between an annular first region and an annular second region on an inner side of the first region in the base material over substantially an entire circumference of the resonator.

17 Claims, 21 Drawing Sheets

(56) References Cited

U.S. PATENT DOCUMENTS

| | | | |
|---|---|---|---|
| 8,555,717 B2* | 10/2013 | Fell | G01C 19/5684 |
| | | | 73/504.13 |
| 2010/0032789 A1* | 2/2010 | Schoen | B81B 3/007 |
| | | | 257/467 |
| 2011/0023601 A1* | 2/2011 | Ikeda | G01C 19/5684 |
| | | | 73/504.13 |
| 2011/0308315 A1 | 12/2011 | Araki et al. | |
| 2013/0192368 A1* | 8/2013 | Fell | G01C 19/5719 |
| | | | 73/504.13 |
| 2019/0078885 A1* | 3/2019 | Tracy | G01C 19/5691 |

* cited by examiner

OUTSIDE ←——→ INSIDE
RADIAL DIRECTION

FIG. 9A
FIG. 9B
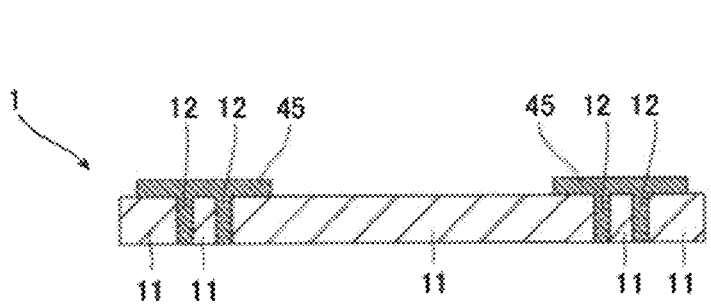
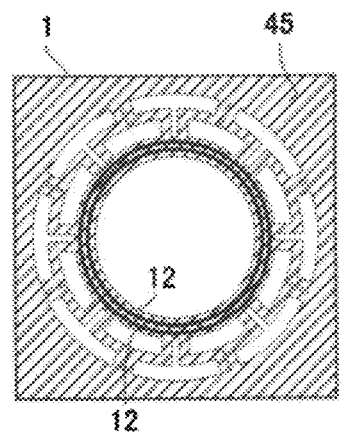
FIG. 10A
FIG. 10B
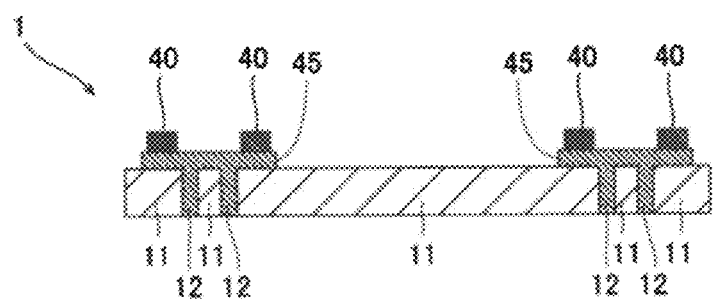
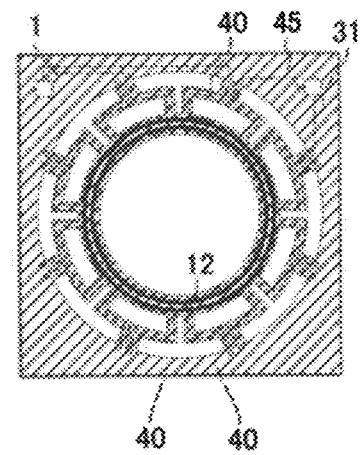
FIG. 11A
FIG. 11B
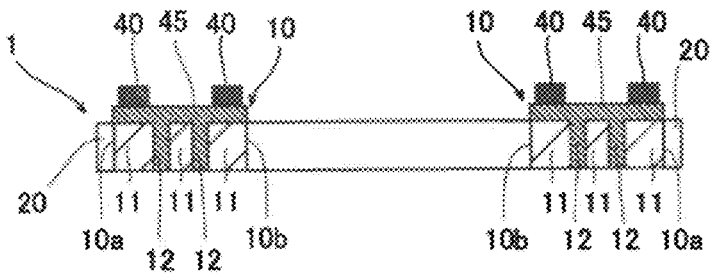
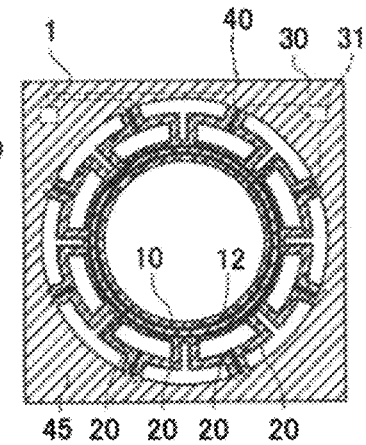

FIG. 12A     FIG. 12B
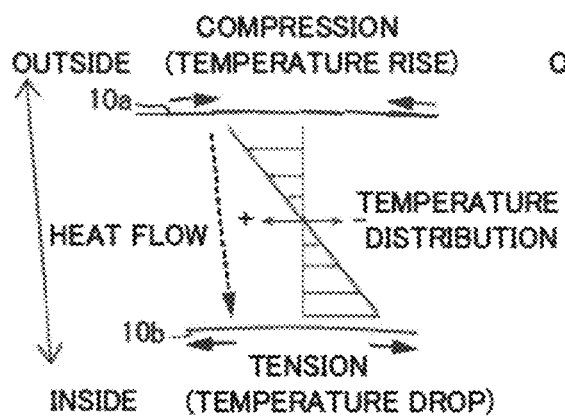
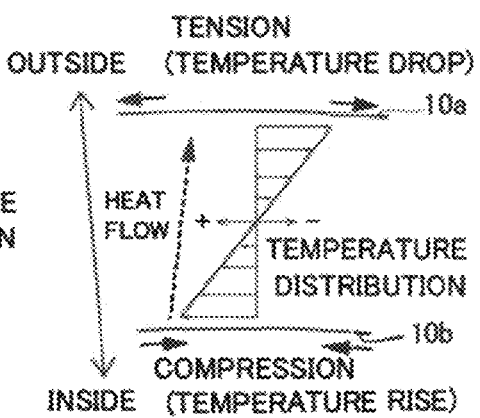

901-901 CROSS-SECTION 902-902 CROSS-SECTION 904-904 CROSS-SECTION

INSIDE ←——→ OUTSIDE
RADIAL DIRECTION

FIG. 37A FIG. 37B FIG. 37C
FIG. 37D FIG. 37E FIG. 37F
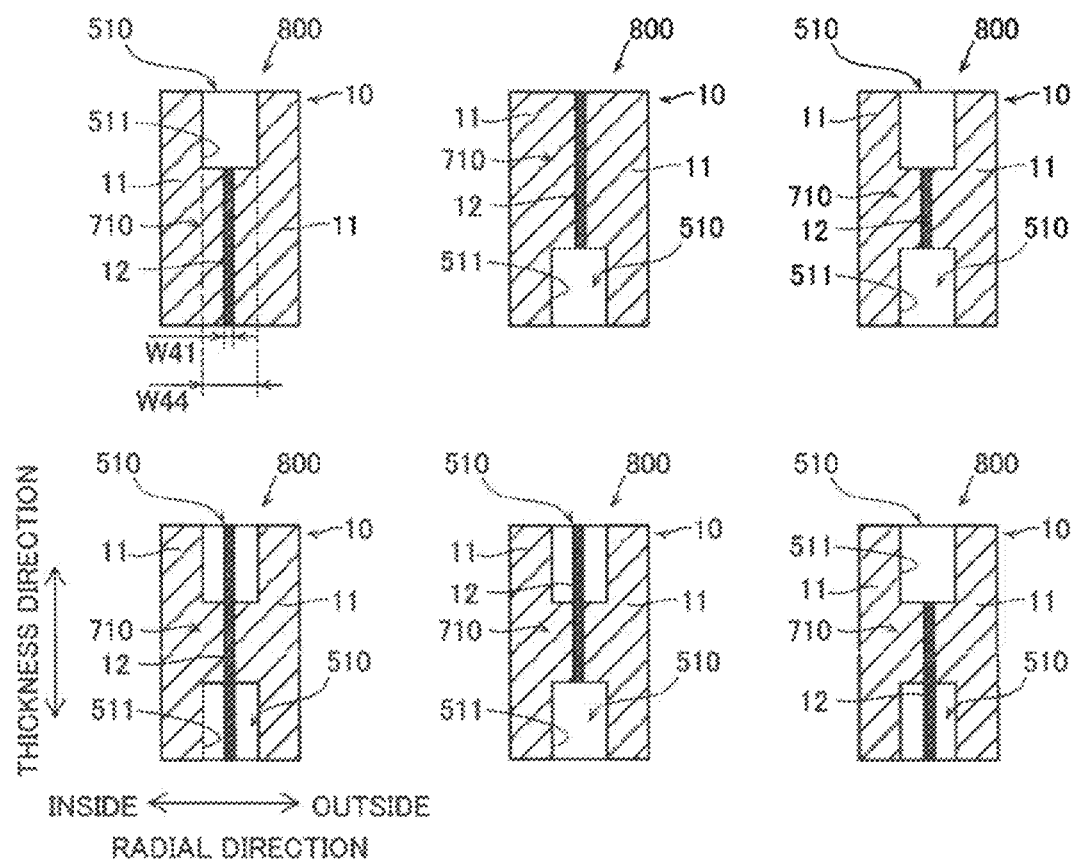
FIG. 38
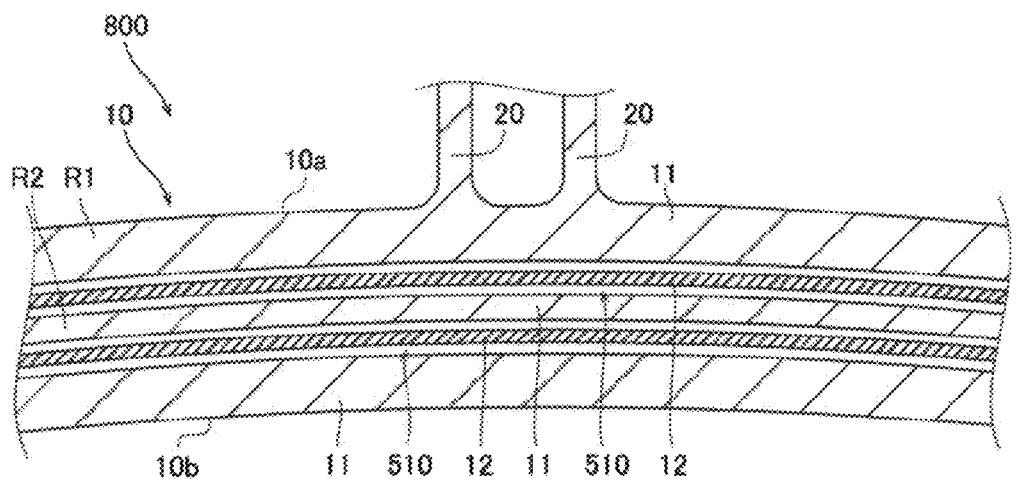

ANGULAR RATE SENSOR

TECHNICAL FIELD

The present invention relates to an angular rate sensor, and more particularly, it relates to an angular rate sensor including an annular resonator.

BACKGROUND ART

Conventionally, an angular rate sensor including an annular resonator is known (see Patent Document 1, for example).

Patent Document 1 discloses an angular rate sensor including an annular silicon ring resonator and a plurality of support beams that support the resonator. This angular rate sensor vibrates the resonator with an electric drive. The annular structure of the resonator is deformed due to the vibrations such that a temperature gradient is generated in the resonator, and a heat loss occurs due to a heat flow (heat transfer) that flows through the resonator. Patent Document 1 discloses that a plurality of slots are provided in the resonator, and the generated heat flow bypasses the slots such that the length of a path through which the heat flows increases, and a Q value indicating a small loss caused by the heat flow is increased (the heat loss due to heat transfer is decreased).

Although not explicitly described in Patent Document 1, the slots provided in the resonator are conceivably through-holes formed in the resonator, which is a silicon ring.

PRIOR ART

Patent Document

Patent Document 1: Japanese Translation of PCT International Application Publication No. 2013-538858

SUMMARY OF THE INVENTION

Problems to be Solved by the Invention

However, in Patent Document 1, the following problems occur. First, annular slots (through-holes) cannot be formed in the resonator, for example, and there are structural constraints on the lengths of the slots and the number of slots from the viewpoint of ensuring the rigidity of the resonator. Second, a heat flow (heat transfer) occurs in a region between adjacent slots, and thus when the constraints on the lengths of the slots and the number of slots are also taken into consideration, there is a limit on the effect of increasing the Q value by simply providing slots. Therefore, it is desired to reduce the structural constraints while the Q value is increased as compared with the case in which the slots are not provided, and achieve overall performance improvement.

The present invention has been proposed in order to solve the aforementioned problems, and one object of the present invention is to provide an angular rate sensor in which structural constraints can be reduced while a Q value is increased and overall performance improvement can be achieved.

Means for Solving the Problems

In order to attain the aforementioned object, an angular rate sensor according to an aspect of the present invention includes an annular resonator and a support that connects the resonator to a fixed portion and supports the resonator, and the resonator includes an annular base material made of a first material, and an annular first low thermal conductor made of a second material having a lower thermal conductivity than the first material, the first low thermal conductor being sandwiched between an annular first region and an annular second region on an inner side of the first region in the base material over substantially an entire circumference of the resonator. Note that in this specification, the first low thermal conductor as a whole is formed annularly over substantially the entire circumference of the resonator, but it does not need to be continuous over the entire circumference of the resonator and indicates a wider concept including the structure in which a plurality of first low thermal conductors aligned at intervals along the circumferential direction of the resonator as a whole are provided over substantially the entire circumference of the resonator. In addition, the first low thermal conductor sandwiched between the first region and the second region indicates a wider concept including not only the case in which the first low thermal conductor is in contact with the first region and the second region, but also the case in which the first low thermal conductor is arranged between and spaced apart from the first region and the second region.

In the angular rate sensor according to the present invention, a heat loss due to heat transfer from the inside of the resonator to the outside of the resonator or from the outside of the resonator to the inside of the resonator can be significantly reduced or prevented by the first low thermal conductor made of the second material having a lower thermal conductivity than the base material in the resonator. Furthermore, the first low thermal conductor is annularly provided, and thus heat transfer can be effectively significantly reduced or prevented over substantially the entire circumference of the resonator. In addition, the first low thermal conductor made of the second material has no limitation on its length and the number thereof unlike the case in which a through-hole (slot) is formed, and thus the effect of increasing a Q value is not limited by structural constraints. Consequently, the Q value can be effectively increased. Moreover, the first low thermal conductor made of the second material is provided in the base material, and thus the rigidity of the resonator can be ensured even when the number of annular first low thermal conductors is increased. Consequently, the structural constraints can be reduced while the Q value is increased (the heat loss due to heat transfer is reduced), and overall performance improvement can be achieved. In the angular rate sensor according to the present invention, a through-hole (slot) may be formed within the structural constraints. In this case, further performance improvement can be expected by the synergy of the effect of increasing the Q value by the through-hole and the effect of the annular first low thermal conductor.

In the angular rate sensor according to the present invention, the first low thermal conductor preferably includes a plurality of first low thermal conductors provided in a radial direction of the resonator. That is, the plurality of first low thermal conductors are provided concentrically. For the temperature gradient of the resonator, a compressive stress and a tensile stress are alternately generated on the inner peripheral side and the outer peripheral side of the resonator due to vibrations such that a temperature difference in the radial direction is largest, and a heat loss due to heat transfer in the radial direction is largely influenced. Therefore, even when a temperature gradient in the radial direction is generated due to vibrations of the resonator, heat transfer can be significantly reduced or prevented by the plurality of first low thermal conductors aligned in the radial direction, and thus the Q value can be more effectively increased.

In the angular rate sensor according to the present invention, the first low thermal conductor is preferably formed through substantially an entire thickness of the resonator. Consequently, even when heat transfer due to vibrations occurs in the radial direction, the heat transfer can be effectively significantly reduced or prevented by the first low thermal conductor formed over substantially the entire resonator in the thickness direction. Therefore, the Q value can be more effectively increased.

In the angular rate sensor according to the present invention, the first low thermal conductor preferably penetrates the base material in a thickness direction of the resonator and is preferably continuous over the entire circumference of the resonator in a circumferential direction so as to divide the base material. That is, the first region and the second region of the base material are divided into the inner peripheral side and the outer peripheral side by the annular first low thermal conductor. Consequently, even when heat transfer due to vibrations occurs in the radial direction, heat transfer between the first region and the second region can be effectively significantly reduced or prevented. Therefore, the Q value can be more effectively increased.

The angular rate sensor according to the present invention preferably further includes a second low thermal conductor made of the second material and provided at a coupling between the resonator and the support. When a temperature gradient is generated between the outer peripheral side and the inner peripheral side of the resonator, not only heat transfer between the outer peripheral side and the inner peripheral side of the resonator but also heat transfer to the coupling between the resonator and the support occurs, and may be a factor in decreasing the Q value of the angular rate sensor. Therefore, the second low thermal conductor is provided such that heat transfer from the resonator to the support via the coupling can be significantly reduced or prevented, and the Q value can be increased.

In the angular rate sensor according to the present invention, a front surface of the first low thermal conductor is preferably substantially flush with a front surface of the base material, and the resonator preferably includes wiring that crosses over the first low thermal conductor. Note that the expression "substantially flush with" indicates that the positions in the thickness direction are aligned with each other within a range in which the wiring that extends across the base material and the first low thermal conductor can be formed, and indicates a concept that allows surface misalignment within the range in which the wiring can be formed. When a through-hole (slot) is provided in the resonator, wiring for driving the resonator and wiring for detecting vibrations cannot be formed on the through-hole (slot), and there is a limitation on formation of the wiring. On the other hand, in the configuration in which the first low thermal conductor is provided in the resonator, no void (through-hole) is formed, and thus the wiring can be arranged on the first low thermal conductor. Therefore, the shape of the wiring can be freely optimized without being constrained by the first low thermal conductor. Consequently, the wiring can be formed on the resonator with a wiring shape that enables a low electrical loss and lower noise, for example.

In the angular rate sensor according to the present invention, the first material is preferably silicon, and the second material is preferably a silicon oxide. Accordingly, the first low thermal conductor made of a silicon oxide can be easily formed using thermal oxidation treatment to silicon, for example. Furthermore, for example, silicon dioxide has a thermal conductivity of about $\frac{1}{100}$ of that of silicon, and thus heat transfer can be effectively significantly reduced or prevented.

In the angular rate sensor according to the present invention, at least one of an outer peripheral surface or an inner peripheral surface of the resonator preferably includes an end face layer made of the second material. Accordingly, when a temperature gradient is generated between the outer peripheral side and the inner peripheral side of the resonator, the end face layer made of the second material having a lower thermal conductivity than the first material is provided on at least one of the outer peripheral surface or the inner peripheral surface on which a temperature difference is largest. Therefore, the end face layer made of the second material having a low thermal conductivity is arranged at a location (the outer peripheral surface or the inner peripheral surface) at which the temperature difference is largest, and thus as compared with the case in which the outer peripheral surface and the inner peripheral surface are made of the base material of the first material, heat transfer in the radial direction can be effectively significantly reduced or prevented by the end face layer. Furthermore, the outer shape (at least one of the outer peripheral surface or the inner peripheral surface) of the resonator is determined by the end face layer. The end face layer and the first low thermal conductor are made of the same second material, and thus the outer shape of the resonator and the position of the first low thermal conductor can be determined by patterning using a common mask, for example, when the angular rate sensor is produced. Consequently, as compared with the case in which the outer shape of the resonator and the first low thermal conductor are formed by separate patterning processes, the relative positional accuracy between the outer shape of the resonator and the first low thermal conductor can be improved, and thus it is possible to improve the vibration characteristics of the angular rate sensor and achieve performance improvement.

In the angular rate sensor according to the present invention, the first low thermal conductor preferably includes a break in its portion in a circumferential direction of the resonator, and the base material on an inner peripheral side of the first low thermal conductor and the base material on an outer peripheral side of the first low thermal conductor are preferably electrically connected to each other via the first material arranged in the break. When the second material of the first low thermal conductor has an insulator or a high electric resistance, the first region and the second region of the base material may be electrically separated from each other and have independent potentials (have so-called float potentials). In such a case, the first low thermal conductor includes the break in its portion such that the first region and the second region can have the same potential. Consequently, even when the first low thermal conductor is provided, it is possible to avoid generation of electrical noise due to a difference in potential between the first region and the second region.

In this case, the first low thermal conductor preferably includes a plurality of first low thermal conductors provided in a radial direction of the resonator, and formation positions of respective breaks of the plurality of first low thermal conductors are preferably different from each other in the circumferential direction. The breaks in the first low thermal conductors electrically connect the first region to the second region, and may be a passage for heat generated due to vibrations. Therefore, the formation positions of the breaks are different from each other in the circumferential direction such that the path length of a heat transfer path can be increased, and thus the Q value can be increased even when the breaks are provided in the first low thermal conductors.

In the angular rate sensor according to the present invention, the first low thermal conductor is preferably provided continuously over the entire circumference of the resonator so as to divide the base material, the base material on an inner peripheral side of the first low thermal conductor and the base material on an outer peripheral side of the first low thermal conductor are preferably electrically separated from each other, and the resonator preferably includes, on a front side or a back side of the resonator with respect to the first low thermal conductor and the base material, a conductive layer that conducts electricity to the base material that has been divided. Accordingly, even when the first region and the second region of the base material are electrically separated by the first low thermal conductor, the first region and the second region can have the same potential due to the conductive layer on the front side or the back side of the resonator. Consequently, even when the first low thermal conductor is provided, it is possible to avoid generation of electrical noise due to a difference in potential between the first region and the second region.

In the angular rate sensor according to the present invention, the support preferably includes support base materials each made of the first material, and a third low thermal conductor made of the second material and sandwiched between the support base materials from both sides in a width direction of the support. Accordingly, when a temperature gradient is generated between one side and the other side of the support in the width direction due to vibrations of the support along with vibrations of the resonator, heat transfer from one side to the other side or from the other side to one side can be significantly reduced or prevented by the third low thermal conductor. Consequently, heat losses due to heat transfer not only in the resonator but also in the support can be significantly reduced or prevented.

The angular rate sensor according to the present invention preferably further includes a fourth low thermal conductor including a non-through groove or a through-hole formed in the resonator. Accordingly, heat transfer can be significantly reduced or prevented by the non-through groove or the through-hole of the fourth low thermal conductor.

Therefore, in addition to the first low thermal conductor, the fourth low thermal conductor is provided such that the Q value can be more effectively increased.

In this case, the fourth low thermal conductor and the first low thermal conductor are preferably arranged in a radial direction of the resonator. Accordingly, even when a temperature gradient in the radial direction is generated due to vibrations of the resonator, heat transfer in the radial direction can be effectively significantly reduced or prevented by the fourth low thermal conductor and the first low thermal conductor aligned in the radial direction.

In the configuration including the fourth low thermal conductor, the fourth low thermal conductor and the first low thermal conductor are preferably arranged in a circumferential direction of the resonator. Accordingly, heat transfer can be effectively significantly reduced or prevented by the non-through groove or the through-hole at a location at which the fourth low thermal conductor is formed. In a portion in which the fourth low thermal conductor is not formed in the circumferential direction, heat transfer can be significantly reduced or prevented by the first low thermal conductor. Thus, even when the first low thermal conductor and the fourth low thermal conductor are not formed in a continuous annular shape over the entire circumference of the resonator in the circumferential direction, heat transfer can be significantly reduced or prevented, and thus the structural constraints can be effectively reduced while the Q value is increased.

In this case, the fourth low thermal conductor preferably includes a plurality of fourth low thermal conductors aligned over substantially the entire circumference of the resonator, and the first low thermal conductor is preferably provided between the fourth low thermal conductors in the circumferential direction. Accordingly, the plurality of fourth low thermal conductors are aligned over substantially the entire circumference of the resonator such that heat transfer can be effectively significantly reduced or prevented over the entire circumference of the resonator. Furthermore, the first low thermal conductor is provided between the fourth low thermal conductors such that transfer of heat that passes between the fourth low thermal conductors can be significantly reduced or prevented. Consequently, the Q value can be more effectively increased.

In the configuration including the fourth low thermal conductor, the fourth low thermal conductor preferably includes a groove having a concave shape in a thickness direction of the resonator, and the fourth low thermal conductor and the first low thermal conductor are preferably arranged in the thickness direction. Accordingly, the fourth low thermal conductor and the first low thermal conductor can be provided at the same position in a plan view. In this case, unlike the case in which the fourth low thermal conductor includes a through-hole, even when the fourth low thermal conductor is annularly formed, the structure in which the resonator is not separated and the inner peripheral side and the outer peripheral side of the fourth low thermal conductor are integrally connected can be ensured. Furthermore, in the cross-section of the resonator, heat transfer can be significantly reduced or prevented by the groove at a location at which the fourth low thermal conductor is formed, and the first low thermal conductor is provided in a portion in which the fourth low thermal conductor is not formed such that heat transfer can be significantly reduced or prevented. Consequently, the Q value can be more effectively increased.

Effect of the Invention

According to the present invention, as described above, the structural constraints can be reduced while the Q value is increased, and the overall performance improvement can be achieved.

BRIEF DESCRIPTION OF THE DRAWINGS

FIG. 9A is a schematic sectional view showing a step (4) of producing the angular rate sensor, and FIG. 9B is a schematic plan view corresponding to FIG. 9A.

FIG. 10A is a schematic sectional view showing a step (5) of producing the angular rate sensor, and FIG. 10B is a schematic plan view corresponding to FIG. 10A.

FIG. 11A is a schematic sectional view showing a step (6) of producing the angular rate sensor, and FIG. 11B is a schematic plan view corresponding to FIG. 11A.

FIG. 12A is a schematic view showing a temperature gradient in the case in which a compressive stress is generated on the outer peripheral side of the resonator, and FIG. 12B is a schematic view showing a temperature gradient in the case in which a compressive stress is generated on the inner peripheral side of the resonator.

FIGS. 37A to 37F are enlarged sectional views showing a fourth low thermal conductor of an angular rate sensor according to an eighth embodiment.

FIG. 38 is an enlarged plan view showing a resonator of the angular rate sensor according to the eighth embodiment.

MODES FOR CARRYING OUT THE INVENTION

Embodiments of the present invention are hereinafter described on the basis of the drawings.

First Embodiment

The configuration of an angular rate sensor 100 according to a first embodiment is now described with reference to FIGS. 1 to 11. In the first embodiment, the angular rate sensor 100 is a gyroscope (gyroscope sensor) that can detect a change in angle (angular rate) with respect to the sensor. The angular rate sensor 100 according to the first embodiment is an electronic component (MEMS angular rate sensor) configured as an inertial sensor element by MEMS technology. In this specification, MEMS is described as a microelectromechanical system.

(Overall Configuration of Angular Rate Sensor)

Figure 1:
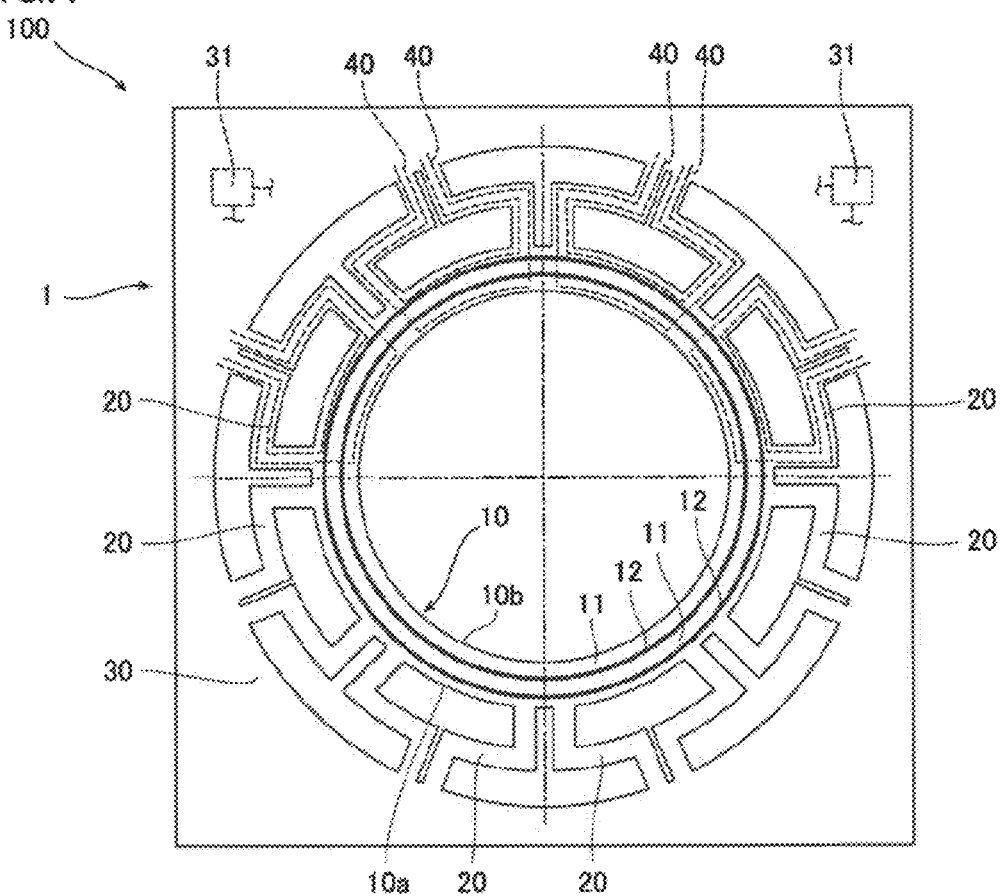
FIG. 1 is a plan view showing the overall configuration of an angular rate sensor according to a first embodiment of the present embodiment.

As shown in FIG. 1, the angular rate sensor 100 includes an annular resonator 10, and supports 20 that connect the resonator 10 to a fixed portion 30 and support the resonator 10. The angular rate sensor 100 is a vibrating structure angular rate sensor that vibrates the resonator 10 and detects an angular rate based on a change in a vibration mode generated according to the action of the angular rate. The angular rate sensor 100 is a ring-shaped vibrating structure angular rate sensor that detects an angular rate using the vibration mode generated in the radial direction of the annular (ring-shaped) resonator 10. The angular rate sensor 100 shown in FIG. 1 is an angular rate sensor that uses an electromagnetic driving system using an electromagnetic force as a driving force.

The angular rate sensor 100 is formed using semiconductor manufacturing techniques such as photolithography and etching on a substrate 1. That is, the resonator 10, the supports 20, and the fixed portion 30 are formed on the flat plate-shaped substrate 1. The annular resonator 10 is arranged at a central portion of the substrate 1. The rectangular fixed portion 30 surrounds the outer periphery of the resonator 10. The fixed portion 30 and the resonator 10 are connected by the beam-shaped supports 20.

In an example of FIG. 1, the supports 20 are provided in pairs, and are provided at eight locations (a total of sixteen supports) at 45 degree intervals in the circumferential direction of the resonator 10. Each support 20 is connected to the resonator 10 at its radially inner end, and is connected to the fixed portion 30 at its radially outer end. The fixed portion 30 is a portion fixed to a package 2 (see FIG. 2), and serves as a fixed end with respect to the resonator 10.

The shapes of the supports 20 and the number of supports 20 are not necessarily limited. For example, the supports 2 may be provided one by one at eight locations at 45 degree intervals. The supports 20 in FIG. 1 include first portions that respectively extend in the radial direction from the resonator 10 and the fixed portion 30, and second portions that extend in the circumferential direction and connect the first portions. The supports 20 may include only the first portions, for example.

On the front surface of the substrate 1, wiring 40 is provided. Although not shown in detail, the wiring 40 is connected to terminals 31 provided on the fixed portion 30, and extend through the supports 20 to the front surface of the resonator 10. The wiring 40 is formed in a predetermined wiring pattern on the front surface of the resonator 10. Although FIG. 1 shows only an upper half in the figure, the wiring 40 is provided at eight locations at 45-degree intervals in the circumferential direction of the resonator 10 through the supports 20, for example. A plurality of wires units 40 form a circuit for driving the resonator 10 and a circuit for detecting an angular rate on the front surface of the resonator 10.

Figure 2:
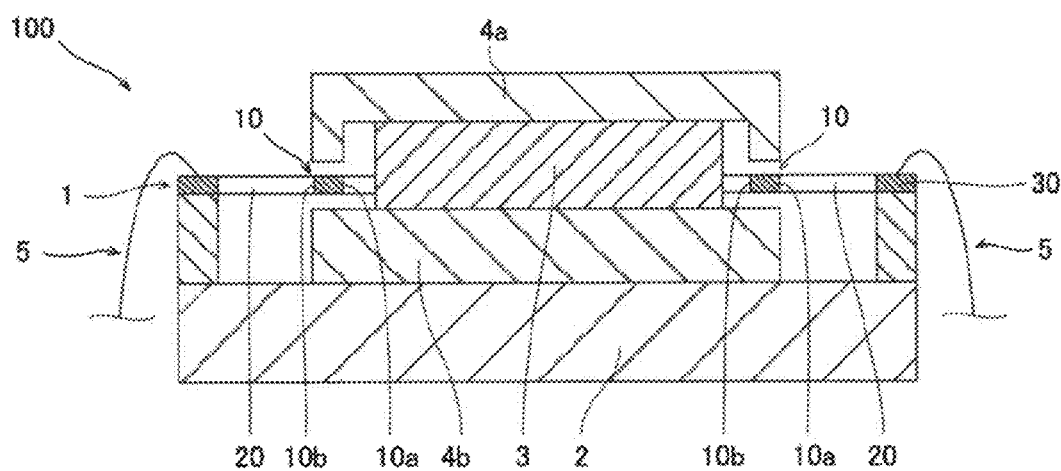
FIG. 2 is a sectional view schematically showing the angular rate sensor according to the first embodiment.

As shown in FIG. 2, a cylindrical magnet 3 and upper and lower poles (magnetic poles) 4a and 4b are provided on the inner peripheral side of the annular resonator 10. The magnet 3 is arranged at a center position of the resonator 10 so as to be surrounded by the resonator 10, and the magnetic poles face each other in an upward-downward direction (the thickness direction of the substrate 1). The poles 4a and 4b are yokes connected to the upper magnetic pole and the lower magnetic pole of the magnet 3, respectively. The upper pole 4a extends radially outward to just above the resonator 10, and then extends downward to face the upper surface of the resonator 10. The lower pole 4b extends radially outward to just below the resonator 10.

Figure 3:
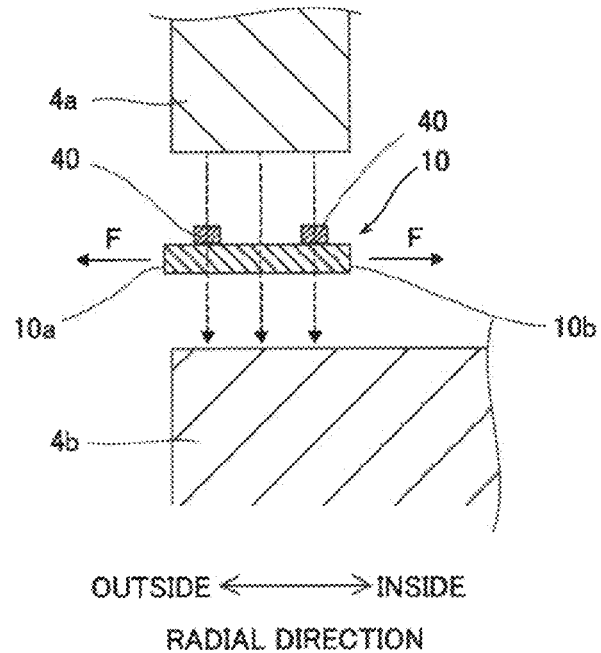
FIG. 3 is a schematic enlarged sectional view for illustrating the principle of driving a resonator.
Figure 4:
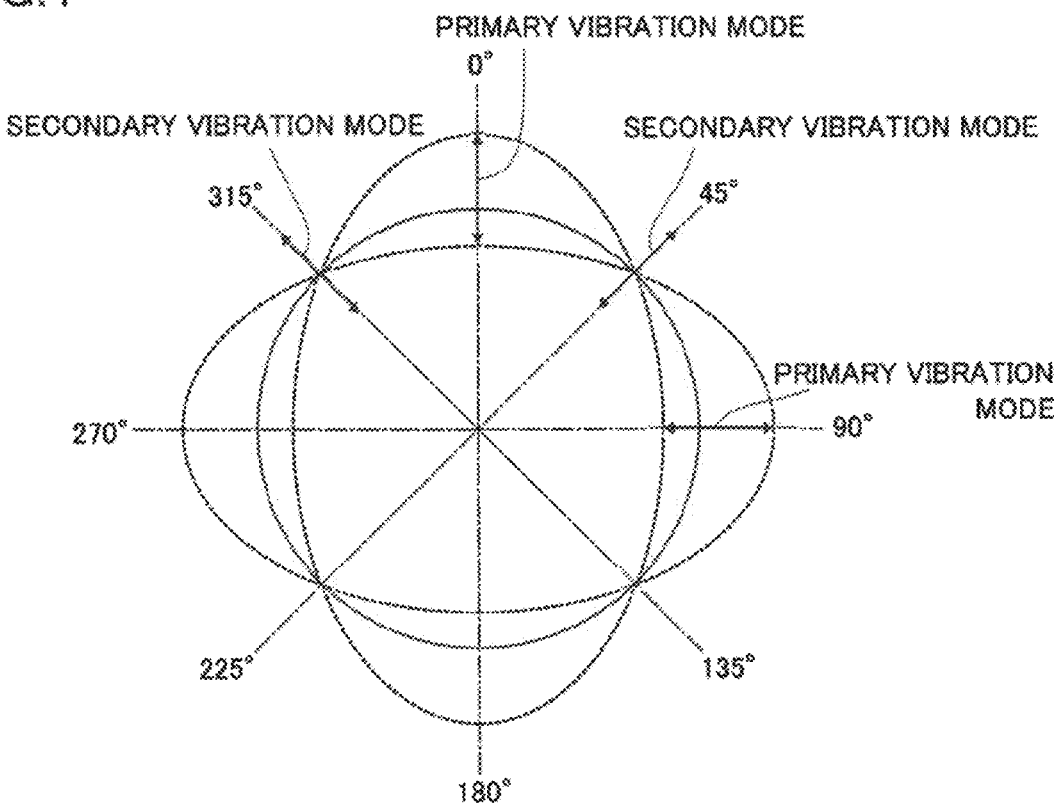
FIG. 4 is a schematic view for illustrating a primary vibration mode and a secondary vibration mode of the resonator.

As shown in FIG. 3, a magnetic field is generated from one of the poles 4a and 4b toward the other (from the pole 4a toward the pole 4b in FIG. 3), and lines of magnetic force penetrate the resonator 10. When a current is supplied to the wiring 40 for driving, a Lorentz force F acts on the resonator 10 in the radial direction. An alternating current of a predetermined frequency is supplied to the wiring 40 for driving such that the upper end position in FIG. 1 is set to 0 degrees, and a vibration mode of cos 2θ is obtained in the circumferential direction, for example. In this case, as shown in FIG. 4, vibrations in a primary vibration mode (a mode in which an antinode of an amplitude occurs every 90 degrees from 0 degrees) in which the resonator 10 is deformed by the Lorentz force F so as to alternately repeat a vertically long elliptical shape and a horizontally long elliptical shape are generated in the plane (radial direction) of the resonator 10. When an angular rate is applied to the resonator 10, a Coriolis force acts on the primary vibration mode, and vibrations in a secondary vibration mode (a mode in which an antinode of a vibration occurs every 90 degrees from 45 degrees) inclined at 45 degrees are newly generated in the plane (radial direction) of the resonator 10. The wiring 40 for detection crosses the magnetic field generated by the magnet 3 due to the vibrations in the secondary vibration mode such that an induced electromotive force is generated therein. The generated induced electromotive force is detected from the wiring 40 for detection such that the angular rate is detected. The angular rate sensor 100 is configured to detect the angular rate in this manner.

(Resonator)

Figure 5A:
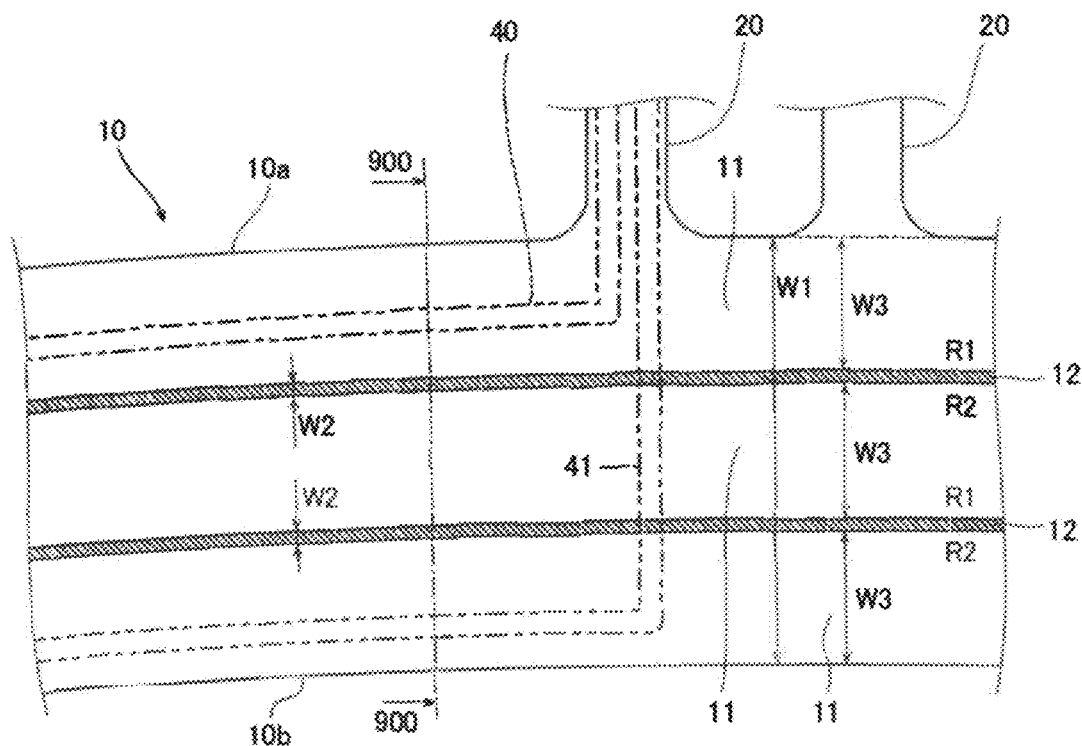
FIG. 5A is an enlarged plan view showing a portion of the resonator.
Figure 5B:
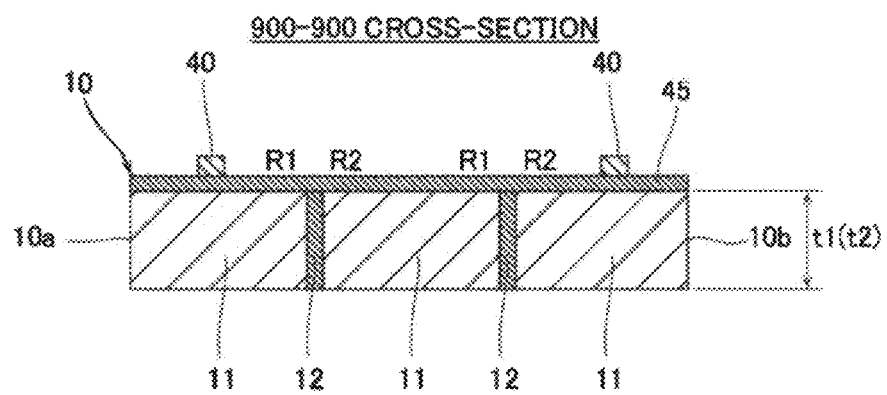
FIG. 5B is a sectional view taken along the line 900-900 in FIG. 5A.

As shown in FIGS. 1 and 5, the resonator 10 includes an annular (see FIG. 1) base material 11 made of a first material and an annular first low thermal conductor 12 made of a second material having a lower thermal conductivity than the first material. FIG. 5(A) is an enlarged view of the front surface (upper surface) of the resonator 10, and FIG. 5(B) is a schematic view showing a cross-section of the resonator 10 along the radial direction (line 900-900).

The base material 11 is a main portion that constitutes the resonator 10. The first material of which the base material 11 is made is common to materials of which the supports 20 are made. The first material is silicon, for example. In this case, the base material 11 is configured as a portion of the substrate 1 made of silicon. That is, the base material 11 of the fixed portion 30, the supports 20, and the resonator 10 is integrally formed in the same silicon substrate. The first material may be a material other than silicon. For example, the first material may be silicon germanium, silicon carbide, gallium nitride, gallium arsenide, or the like. When the fixed portion 30, the supports 20, and the resonator 10 are made of common first materials, a manufacturing process is facilitated as compared with the case in which different materials are used.

The base material 11 has a predetermined width (radial width) W1 so as to define the outer shape of the resonator 10. That is, the base material 11 defines the outer peripheral surface 10a and the inner peripheral surface 10b of the resonator 10.

The first low thermal conductor 12 extends along the circumferential direction of the resonator 10. In an example of FIG. 5, the first low thermal conductor 12 is sandwiched between an annular first region R1 and an annular second region R2 on the inner side of the first region R1 in the base material 11 over substantially the entire circumference of the resonator 10. In other words, the first low thermal conductor 12 is arranged between the annular first region R1 and the annular second region R2. In the example of FIG. 5, the base material 11 is partitioned by the first low thermal conductor 12 into the outer first region R1 and the inner second region R2 in a plan view. The first low thermal conductor 12 is arranged between the outer peripheral surface 10a and the inner peripheral surface 10b of the resonator 10. The first low thermal conductor 12 is provided in contact with the base material 11 of the first region R1 and the base material 11 of the second region R2. In other words, the first low thermal conductor 12 is embedded in the base material 11 so as to partition the base material 11 into the first region R1 and the second region R2.

Note that the first region R1 and the second region R2 are concepts showing regions of the base material 11 arranged on the outer side and the inner side of the first low thermal conductor 12, respectively. Therefore, as described below, when two first low thermal conductors 12 are provided as shown in FIGS. 1 and 5, a region arranged between the two first low thermal conductors 12 is the second region R2 for the outer first low thermal conductor 12 as well as the first region R1 for the inner first low thermal conductor 12. The first region R1 and the second region R2 of the base material 11 and the first low thermal conductor 12 are arranged concentrically (see FIG. 1), and their centers coincide with each other at the center of the resonator 10.

The second material of which the first low thermal conductor 12 is made is not particularly limited as long as the same has a lower thermal conductivity than the first material. The second material may have conductivity or may be an insulator. For example, the second material is a silicon oxide. When the first material is silicon and the second material is a silicon oxide, the first low thermal conductor 12 made of the second material can be formed by a thermal oxidation method. That is, the second material may be a silicon thermal oxide film. The second material may be a silicon nitride, alumina, or the like.

The thermal conductivity $\lambda 1$ of silicon as the first material is about 148 [W/(m·K)], and the thermal conductivity $\lambda 2$ of $SiO_2$, which is a silicon oxide, as the second material, is about 1.38 [W/(m·K)]. Therefore, $\lambda 1 > \lambda 2$ is satisfied.

The first low thermal conductor 12 has a solid structure made of the second material. A plurality of first low thermal conductors 12 are provided in the radial direction of the resonator 10. In FIG. 5(A), the two first low thermal conductors 12 are provided concentrically in the resonator 10 (see FIG. 1). The two first low thermal conductors 12 are provided between the outer peripheral surface 10a and the inner peripheral surface 10b so as to divide the base material 11 into three equal parts. The first low thermal conductors 12 may not divide the base material 11 equally. The base material 11 is divided equally such that the symmetry of the first low thermal conductors 12 and the base material 11 in the resonator 10 can be ensured.

The first low thermal conductor 12 has a width W2 in the radial direction. In FIG. 5(A), the width W2 of the first low thermal conductor 12 is smaller than the width W3 of the first region R1 or the second region R2. Note that the width W2 of the first low thermal conductor 12 may be larger than the width W3 of the first region R1 or the second region R2. The volume ratio of the first low thermal conductor 12 to the entire resonator 10 may be larger than the volume ratio of the base material 11 to the entire resonator 10.

As shown in FIG. 5(B), the first low thermal conductor 12 is formed over substantially the entire thickness of the resonator 10. The first low thermal conductor 12 penetrates the base material 11 in the thickness direction. That is, the thickness t2 of the first low thermal conductor 12 is substantially equal to the thickness t1 of the base material 11.

As shown in FIG. 1, the first low thermal conductor 12 has a continuous annular shape over the entire circumference of the resonator 10. That is, the first low thermal conductor 12 is continuous. Therefore, the first low thermal conductor 12 penetrates the resonator 10 in the thickness direction and is continuous over the entire circumference of the resonator 10 in the circumferential direction so as to divide the base material 11. Thus, the base material 11 is divided into three concentric portions by the two first low thermal conductors 12. The three portions of the base material 11 and the two first low thermal conductors 12 are connected to each other at radial end faces (the inner peripheral surface and the outer peripheral surface).

The first low thermal conductors 12 that penetrate the base material 11 in the thickness direction are exposed to the upper and lower surfaces of the base material 11. The upper and lower surfaces of the base material 11 are substantially flat surfaces. That is, the upper and lower surfaces of the first low thermal conductors 12 are provided on substantially the same plane as the upper and lower surfaces of the base material 11, respectively. Therefore, the wiring 40 can be provided on the upper surfaces of the first low thermal conductors 12 and the base material 11, as shown by a two-dot chain line in FIG. 5(A). That is, the resonator 10 includes the wiring 40 that crosses over the first low thermal conductors 12. The wiring 40 crosses over the first low thermal conductors 12 at its portion 41 that extends in the radial direction. As shown in FIG. 5(B), the wiring 40 is provided on the upper surface of the resonator 10 via an insulating film 45. Note that the first low thermal conductors 12 may protrude in the thickness direction from the front surface of the base material 11, or may be recessed in the thickness direction from the front surface of the base material 11.

Method for Producing Angular Rate Sensor

A method for producing the angular rate sensor 100 according to the first embodiment is now described with reference to FIGS. 6 to 11. In particular, a method for forming the first low thermal conductor 12 is described. An example in which the first material is silicon and the second material is a silicon oxide is described below.

Figure 6A:
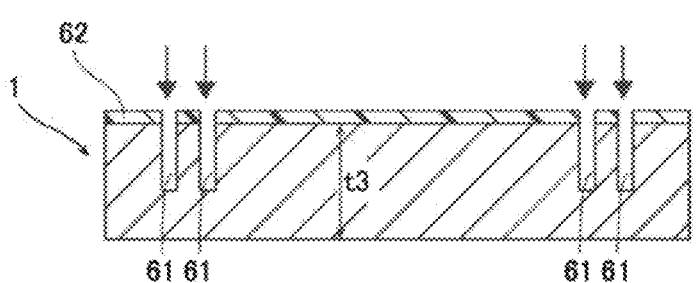
FIG. 6A is a schematic sectional view showing a step (1) of producing the angular rate sensor.
Figure 6B:
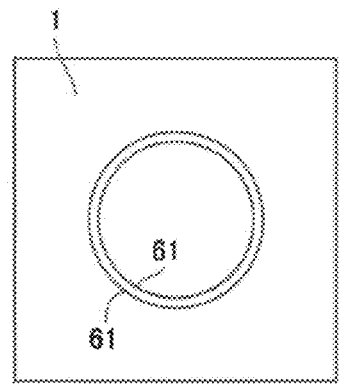
FIG. 6B is a schematic plan view corresponding to FIG. 6A.

First, as shown in FIG. 6, annular slits (grooves) 61 corresponding to the first low thermal conductors 12 are formed in the flat-plate shaped substrate 1 made of the first material. The substrate 1 before processing has a flat plate shape without through-holes in an unprocessed state, and has a thickness t3 larger than the thickness t1 of the base material 11 in FIG. 5(B), which shows a finished product.

The slits 61 are formed by forming a resist film 62 on the front surface of the substrate 1 and etching a slit pattern formed by photolithography, for example. The number of provided slits 61 corresponds to the number of (two) first low thermal conductors 12. The widths of the slits 61 are substantially equal to the widths W2 of the first low thermal conductors 12, and the depths of the slits 61 are set to a value larger than the thicknesses t2 of the first low thermal conductors 12.

Figure 7A:
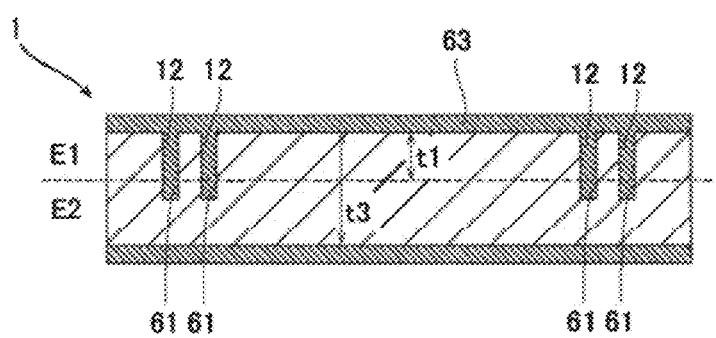
FIG. 7A is a schematic sectional view showing a step (2) of producing the angular rate sensor.
Figure 7B:
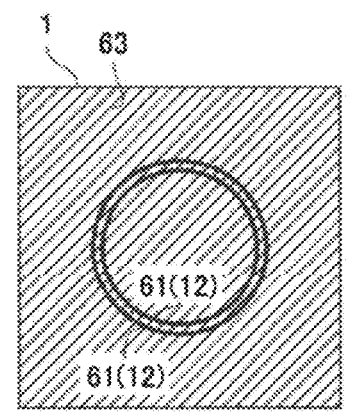
FIG. 7B is a schematic plan view corresponding to FIG. 7A.

Next, as shown in FIG. 7, the slits 61 formed in the substrate 1 are filled with the second material, and a second material layer 63 is formed. The second material layer 63 is formed on the slits 61 and the front surface of the substrate 1 by silicon thermal oxidation, for example. In that case, the second material layer 63 is a silicon thermal oxide film ($SiO_2$ film). During a heat treatment process, the silicon surface of the substrate 1 including the slits 61 is oxidized to form the second material layer 63, and the second material layer 63 grows such that the volume increases with the process. Consequently, the insides of the annular slits 61 are filled with the second material (silicon oxide ($SiO_2$)). The filling of the slits 61 with the second material may be performed by a CVD method or a sputtering method, for example.

Figure 8A:
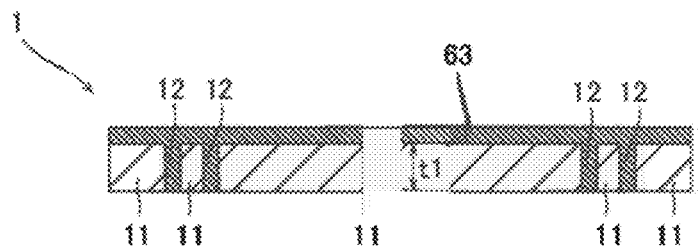
FIG. 8A is a schematic sectional view showing a step (3) of producing the angular rate sensor.
Figure 8B:
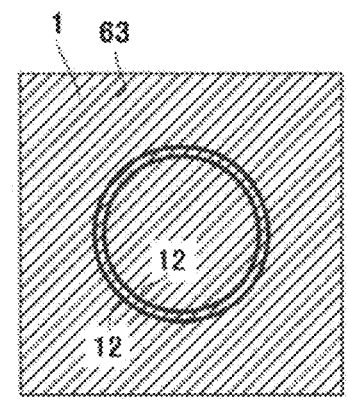
FIG. 8B is a schematic plan view corresponding to FIG. 8A.

Next, the lower side of the substrate 1 is removed (background) such that the substrate 1 has a predetermined thickness t1 shown in FIG. 7. That is, a lower side portion E2 of the substrate 1 excluding a range E1 indicated by a broken line in FIG. 7 is removed by machining (grinding). The machining is performed in a range including the lower ends of the slits 61. Consequently, as shown in FIG. 8, the annular first low thermal conductors 12 are formed in the substrate 1 having a thickness t1.

Next, as shown in FIG. 9, the insulating film 45 is formed on the surface of the substrate 1. The second material layer 63 formed on the front surface of the substrate 1 is used as the insulating film 45. The second material layer 63 is removed, except for a predetermined pattern including wiring paths that cover front surfaces of the resonator 10, the supports 20, and the fixed portion 30, by etching.

Consequently, the remaining second material layer 63 forms the insulating film 45 corresponding to the wiring path.

Next, as shown in FIG. 10, the wiring 40 is formed on the insulating film 45 by a known wiring pattern forming process. Although not illustrated, a metal layer that constitutes the wiring 40 is formed on the insulating film 45, and the wiring 40 of the wiring pattern shown in FIG. 1 is formed on the insulating film 45 by patterning on the formed metal layer.

Next, through-holes are formed in the substrate 1 such that the resonator 10, the supports 20, and the fixed portion 30 are formed. First, a resist film is formed on the entire front surface of the substrate 1, and the outer shape pattern of the resonator 10, the supports 20, and the fixed portion 30 is formed in the resist film by photolithography. The first low thermal conductors 12 are covered with the resist film corresponding to the resonator 10. Then, the formed outer shape pattern is etched through.

Consequently, as shown in FIG. 11, the through-holes of the outer shape pattern are formed in the substrate 1 such that the resonator 10, the supports 20, and the fixed portion 30 are integrally formed in the substrate 1. That is, the outer peripheral surface 10a and the inner peripheral surface 10b of the resonator 10, the outer peripheral surfaces of the supports 20, and the inner peripheral surface of the fixed portion 30 are defined by the through-holes.

Thereafter, a step of attaching a control circuit to the package 2, a step of bonding wires 5 (see FIG. 2), etc. are performed to produce the angular rate sensor 100.

Advantageous Effects of First Embodiment

According to the first embodiment, the following advantageous effects are achieved.

In the angular rate sensor 100 according to the first embodiment, a heat loss due to heat transfer from the inside of the resonator 10 to the outside of the resonator 10 or from the outside of the resonator 10 to the inside of the resonator 10 can be significantly reduced or prevented over substantially the entire circumference of the resonator 10 by the annular first low thermal conductors 12 made of the second materials each having a lower thermal conductivity than the base material 11. Furthermore, the first low thermal conductors 12 made of the second materials have no limitation on their lengths and the number thereof, and thus the effect of increasing the Q value is not limited by structural constraints. Consequently, the Q value can be effectively increased. In addition, electrode wiring (wiring 40) can be provided on the front surfaces of the first low thermal conductors 12 in the resonator 10, and the rigidity of the resonator 10 can be ensured even when the number of annular first low thermal conductors 12 is increased. Consequently, the structural constraints can be reduced while the Q value is increased (the heat loss due to heat transfer is reduced), and overall performance improvement can be achieved.

The Q value is now described. As shown in FIG. 12, in the resonator 10 of the ring-shaped angular rate sensor 100, bending deformation repeatedly occurs at the time of driving in the primary vibration mode. At this time, a compressive stress and a tensile stress in the circumferential direction repeatedly act on the outer peripheral side and the inner peripheral side of the resonator 10. Consequently, the case in which the compressive stress acts on the outer peripheral surface 10a and the tensile stress acts on the inner peripheral surface 10b as shown in FIG. 12(A) and the case in which the tensile stress acts on the outer peripheral surface 10a and the compressive stress acts on the inner peripheral surface 10b as shown in FIG. 12(B) alternately occur. The temperature of a portion to which the compressive stress is applied slightly increases, and the temperature of a portion to which the tensile stress is applied slightly decreases. Therefore, heat transfer (heat flow) from the outer peripheral surface 10a side to the inner peripheral surface 10b side as shown in FIG. 12(A) and heat transfer (heat flow) from the inner peripheral surface 10b side to the outer peripheral surface 10a side as shown in FIG. 12(B) alternately occur due to a temperature gradient generated during vibrations. The heat transfer during the vibrations of the resonator 10 results in a heat loss in the resonator 10 and lowers the energy efficiency. This heat loss can be evaluated by the Q value of thermoelastic damping.

The Q value is obtained with the following formulas (1) to (4).

[Formula 1]

$$\frac{1}{Q} = \Delta_E \times \frac{\omega\tau}{1+(\omega\tau)^2} \quad (1)$$

$$\Delta_E = \frac{E\alpha^2 T}{c\rho} \quad (2)$$

$$\tau = \frac{b^2}{\pi^2 a} \quad (3)$$

$$a = \frac{\lambda}{c\rho} \quad (4)$$

where $\omega$ represents the driving frequency of the resonator, $\tau$ represents a time constant related to vibrations of the resonator, $a$ represents the temperature conductivity of the resonator, $b$ represents the length of a path through which heat flows, E represents a Young's modulus, $\lambda$ represents the thermal conductivity of the resonator, $c$ represents the specific heat of the resonator, $\rho$ represents the density of the resonator, $\alpha$ represents the linear expansion coefficient of the resonator, and T represents an absolute temperature.

The Q value in the above formula (1) indicates that as the value increases, the heat loss due to heat transfer reduces. In the angular rate sensor 100 according to the first embodiment, the first low thermal conductors 12 made of the second material are provided, and thus the thermal conductivity $\lambda$ of the resonator 10 is a value (resultant value) based on both the thermal conductivity λ1 of the base material 11 and the thermal conductivity λ2 (<λ1) of the first low thermal conductors 12. Therefore, the Q value increases according to the thermal conductivity λ2. In the case of the angular rate sensor 100, (i) the wiring 40 can be formed on the first low thermal conductors 12, (ii) the number of first low thermal conductors 12 can be freely increased, the rigidity can be ensured even when the number of first low thermal conductors 12 is increased, and (iii) the first low thermal conductors 12 can be formed in a continuous annular shape, and the structure can be used in which a path through which heat moves around the first low thermal conductors 12 is not formed. Consequently, in the angular rate sensor 100, as described above, the structural constraints can be reduced while the Q value is increased, and the overall performance improvement can be achieved.

In a comparative example in which the first low thermal conductors 12 were not provided (a resonator including only a silicon base material) and the angular rate sensor 100 according to the first embodiment in which the two first low thermal conductors 12 were provided, substantially common conditions were set to calculate a theoretical Q value. It has been confirmed that in the angular rate sensor 100 according to the first embodiment, the Q value is about ten times that of the angular rate sensor according to the comparative example, and the Q value increases as compared with the case in which the first low thermal conductors 12 are not provided.

In the angular rate sensor 100 according to the first embodiment, the plurality of first low thermal conductors 12 are provided in the radial direction of the resonator 10, and thus even when a temperature gradient in the radial direction is generated due to vibrations of the resonator 10, heat transfer can be significantly reduced or prevented by the plurality of first low thermal conductors 12 aligned in the radial direction. Consequently, heat transfer in the radial direction in which a heat loss is largely influenced can be effectively significantly reduced or prevented, and thus the Q value can be more effectively increased.

In the angular rate sensor 100, even when heat transfer due to vibrations occurs in the radial direction, the heat transfer can be effectively significantly reduced or prevented by the first low thermal conductors 12 formed over substantially the entire resonator 10 in the thickness direction. Therefore, the Q value can be more effectively increased.

In the angular rate sensor 100, the first low thermal conductors 12 penetrate the resonator 10 in the thickness direction and are continuous over the entire circumference of the resonator 10 in the circumferential direction, and thus even when heat transfer due to vibrations occurs in the radial direction, heat transfer between the first region R1 and the second region R2 can be effectively significantly reduced or prevented. Therefore, the Q value can be more effectively increased.

In the angular rate sensor 100, the resonator 10 includes the wiring 40 that crosses over the first low thermal conductors 12, and thus even when the first low thermal conductors 12 are provided in the resonator 10, the shapes of the wiring 40 can be freely optimized without being constrained by the first low thermal conductors 12. Consequently, the wiring 40 can be formed on the resonator 10 with more an accurate wiring shape that enables a low electrical loss, for example.

In the angular rate sensor 100, the first material is silicon, and the second material is a silicon oxide. Accordingly, the first low thermal conductors 12 made of a silicon oxide can be easily formed using thermal oxidation treatment to silicon, for example. Furthermore, for example, silicon dioxide has a thermal conductivity of about 1/100 of that of silicon, and thus heat transfer can be effectively significantly reduced or prevented.

Modified Example of First Embodiment

First Modified Example

Figure 13A:
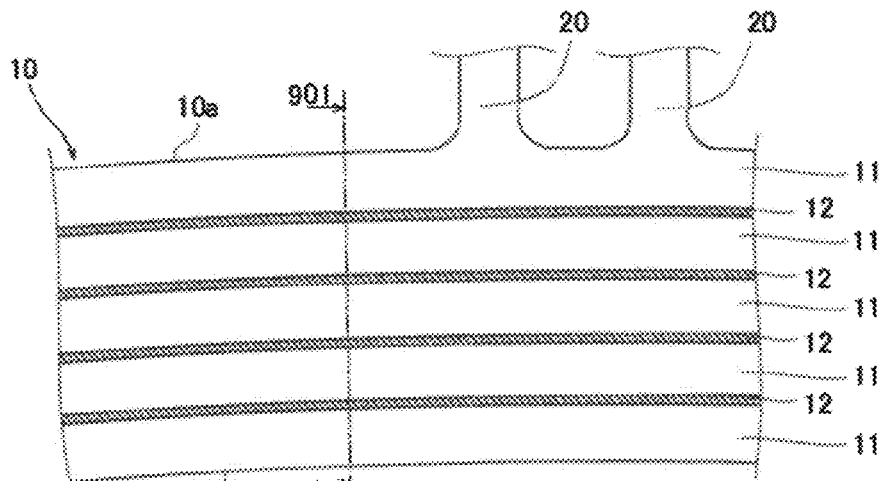
FIG. 13A is an enlarged plan view showing a resonator according to a first modified example.
Figure 13B:
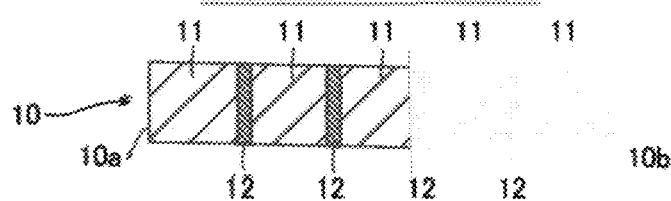
FIG. 13B is a sectional view taken along the line 901-901 in FIG. 13A.

The first low thermal conductors 12 are not limited to the example shown in FIG. 5. In a first modified example shown in FIG. 13(A), a resonator 10 includes four first low thermal conductors 12 aligned concentrically in a radial direction. As shown in FIG. 13(B), each first low thermal conductor 12 penetrates a base material 11 in the thickness direction. Although not shown, each first low thermal conductor 12 is continuous over the entire circumference of the resonator 10 in a circumferential direction.

Second Modified Example

Figure 14A:
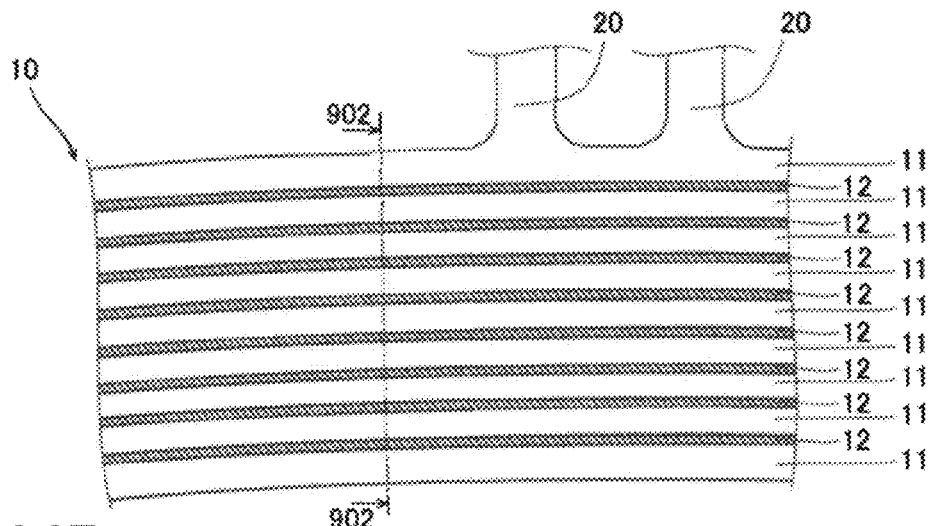
FIG. 14A is an enlarged plan view showing a resonator according to a second modified example.
Figure 14B:
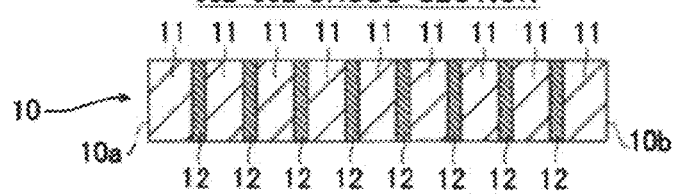
FIG. 14B is a sectional view taken along the line 902-902 in FIG. 14A.

In a second modified example shown in FIG. 14(A), a resonator 10 includes eight first low thermal conductors 12 aligned concentrically in a radial direction. As shown in FIG. 14(B), each first low thermal conductor 12 penetrates a base material 11 in a thickness direction. Although not shown, each first low thermal conductor 12 is continuous over the entire circumference of the resonator 10 in a circumferential direction.

Theoretical Q values were also calculated for the angular rate sensors according to the first and second modified examples. In the first modified example including the four first low thermal conductors 12, the Q value was about 2.3 times that of the configuration according to the first embodiment including the two first low thermal conductors 12, and in the second modified example including the eight first low thermal conductors 12, the Q value was about 6.8 times that of the configuration according to the first embodiment. Thus, it has been confirmed that the Q value is increased by increasing the number of first low thermal conductors 12.

Third Modified Example

Figure 15:
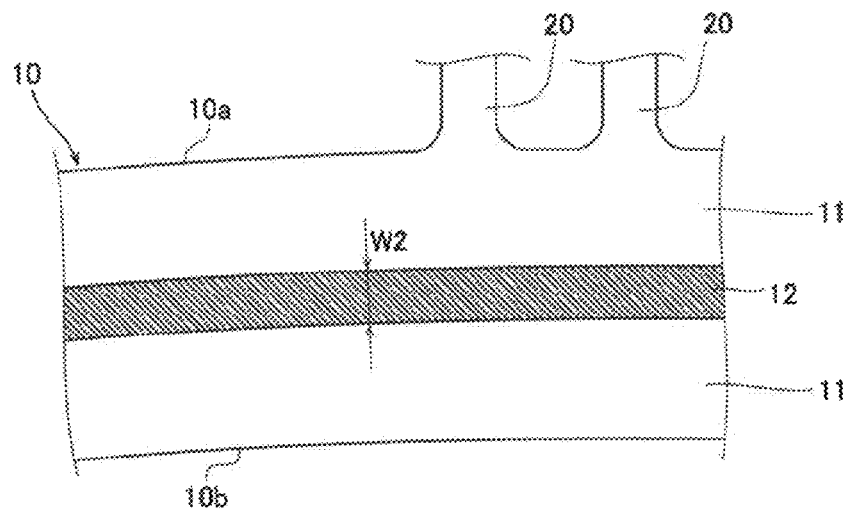
FIG. 15 is an enlarged plan view showing a resonator according to a third modified example.

In a third modified example shown in FIG. 15, a resonator 10 includes one first low thermal conductor 12. In the third modified example, an example is shown in which the width W2 of the first low thermal conductor 12 is larger than those in the first modified example and the second modified example. Although not shown, the first low thermal conductor 12 penetrates a base material 11 in a thickness direction and is continuous over the entire circumference of the resonator 10 in a circumferential direction.

Fourth Modified Example, Fifth Modified Example

Figure 16A:
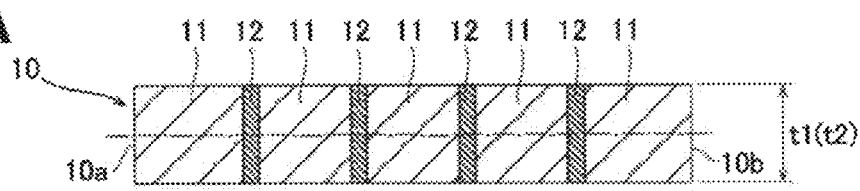
FIG. 16A is a sectional view showing the resonator according to the first modified example.
Figure 16B:
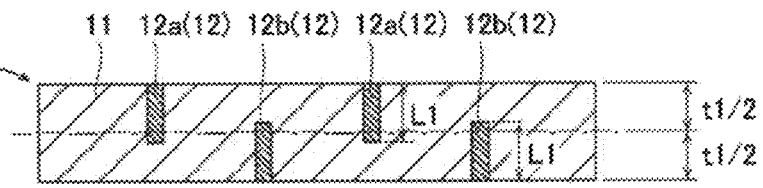
FIG. 16B is a sectional view showing a resonator according to a fourth modified example.

As shown in FIG. 16(A), first low thermal conductors 12 are not limited to an example in which a base material 11 penetrates in a thickness direction, and may not penetrate the base material 11. In a fourth modified example shown in FIG. 16(B), four first low thermal conductors 12 do not penetrate the base material 11 in the thickness direction. Two of the four first low thermal conductors 12 are provided on one surface (upper surface) side of a resonator 10, and the remaining two are provided on the other surface (lower surface) side of the resonator 10. In the fourth modified example, the first low thermal conductors 12 are formed over substantially the entire resonator 10 in the thickness direction due to first low thermal conductors 12a on the upper surface side and first low thermal conductors 12b on the lower surface side.

Figure 16C:
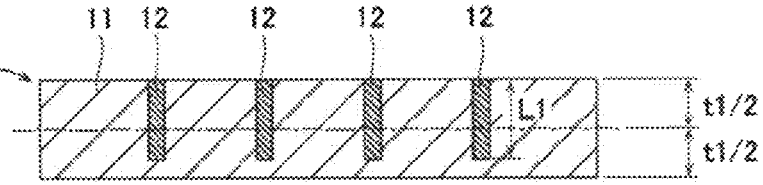
FIG. 16C is a sectional view showing a resonator according to a fifth modified example.

In a fifth modified shown in FIG. 16(C), each of four first low thermal conductors 12 is provided on one surface of a resonator 10, and does not penetrate a base material 11 in a thickness direction. From the viewpoint of significantly reducing or preventing heat transfer, the lengths L1 of the first low thermal conductors 12 in the thickness direction are preferably equal to or more than half (t½) of the thickness t1 of the resonator 10 (base material 11).

Second Embodiment

The configuration of an angular rate sensor 200 according to a second embodiment is now described with reference to FIG. 17. In the second embodiment, an example is described in which second low thermal conductors 110 are provided at couplings CP between a resonator 10 and supports 20 in addition to the first low thermal conductors 12. In the second embodiment, the same configurations as those of the first embodiment are denoted by the same reference numerals, and description thereof is omitted.

Figure 17:
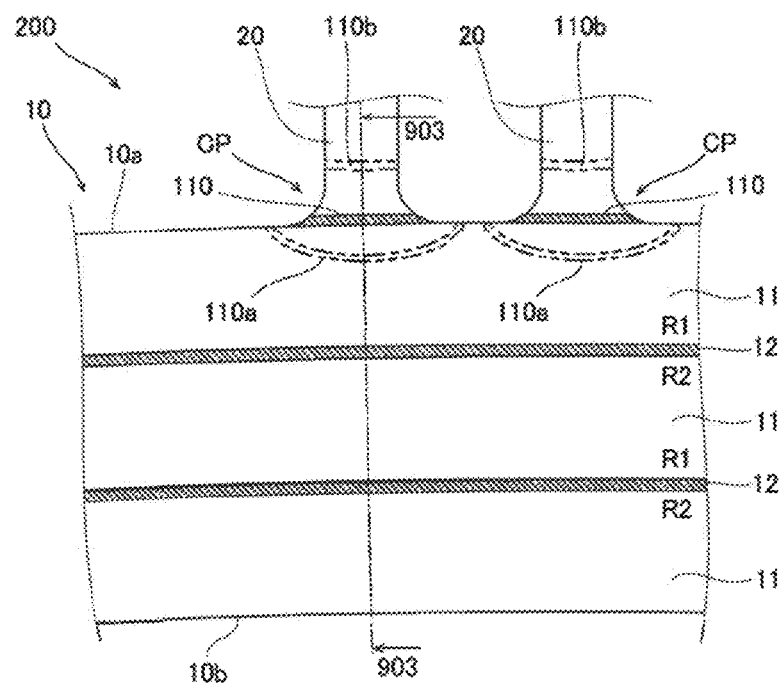
FIG. 17 is an enlarged plan view showing a resonator of an angular rate sensor according to a second embodiment.

As shown in FIG. 17, the angular rate sensor 200 includes, in the resonator 10, first low thermal conductors 12 made of second materials and sandwiched between first regions R1 and second regions R2 in a base material 11. Although not shown, the first low thermal conductors 12 are provided annularly over substantially the entire circumference of the resonator 10.

The angular rate sensor 200 according to the second embodiment includes the second low thermal conductors 110 made of the second materials and provided at the couplings CP between the resonator 10 and the supports 20. Although not shown, in the case in which a plurality of supports 20 are provided, the second low thermal conductors 110 are respectively provided at the couplings CP between the plurality of supports 20 and the resonator 10.

The second low thermal conductors 110 are provided at positions at which the resonator 10 and the supports 20 are divided at the couplings CP between the resonator 10 and the supports 20. That is, the second low thermal conductors 110 are adjacent to the resonator 10 on the radially inner side, and are adjacent to the supports 20 on the radially outer side. The second low thermal conductors 110 penetrate the base material 11 in a thickness direction, for example, and partition the resonator 10 and the supports 20.

The second low thermal conductors 110 may be provided on the resonator 10 side or the support 20 side at the couplings CP between the resonator 10 and the supports 20. For example, second low thermal conductors 110a indicated by two-dot chain lines in FIG. 17 show the case in which the second low thermal conductors 110a are provided on the resonator 10 side at the couplings CP between the resonator 10 and the supports 20. The second low thermal conductors 110a are provided on the resonator 10 side at the couplings CP so as to partition portions on the support 20 side and portions on the resonator 10 side.

Second low thermal conductors 110b indicated by two-dot chain lines in FIG. 17 show the case in which the second low thermal conductors 110b are provided on the support 20 side at the couplings CP between the resonator 10 and the supports 20. The second low thermal conductors 110b are provided on the support 20 side at the couplings CP so as to partition portions on the support 20 side and portions on the resonator 10 side.

Figure 18:
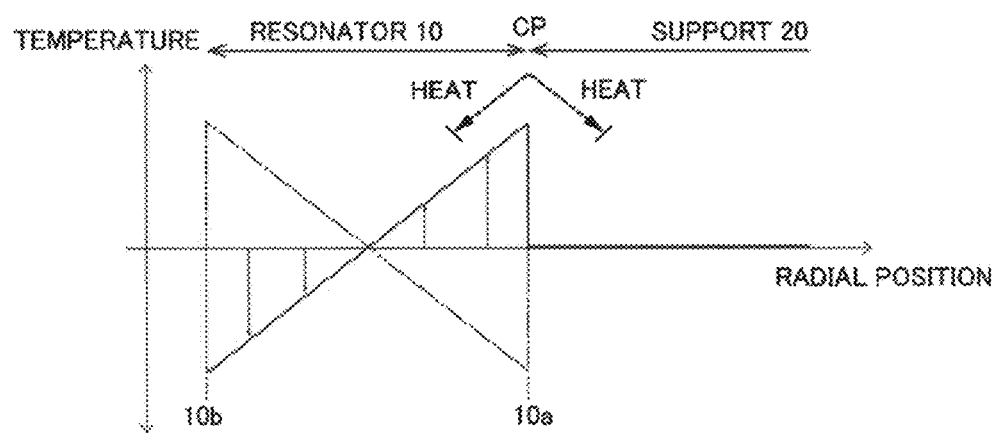
FIG. 18 is a diagram for illustrating an image of a temperature change due to vibrations of the resonator in a cross-section taken along the line 903-903 in FIG. 17.

FIG. 18 is a diagram in which the horizontal axis indicates the radial position and the vertical axis indicates the temperature in the range along the line 903-903 in FIG. 17. As described above, in the resonator 10, a compressive stress and a tensile stress are alternately generated on the inner peripheral surface 10b side and the outer peripheral surface 10a side due to vibrations such that radial temperature distributions are generated. That is, the temperature distribution indicated by a solid line and the temperature distribution indicated by a two-dot chain line alternately occur due to the vibrations. On the other hand, the supports 20 has a higher degree of freedom than the resonator 10, and can move while being deformed along with deformation of the resonator 10, and thus the stress is sufficiently smaller than that in the resonator 10. Therefore, in the supports 20, a temperature change due to vibrations is hardly caused as compared with the resonator 10.

Therefore, at the couplings CP, heat may flow into or out of the supports 20 depending on a temperature difference between the supports 20 and the resonator 10. The second low thermal conductors 110 significantly reduce or prevent heat transfer between the supports 20 and the resonator 10 that occurs depending on a temperature change in the resonator 10. From the viewpoint of significantly reducing or preventing heat transfer, the second low thermal conductors 110 are preferably provided so as to partition the resonator 10 side and the support 20 side at the couplings CP as shown in FIG. 17.

The remaining configurations of the second embodiment are similar to those of the aforementioned first embodiment.

Advantageous Effects of Second Embodiment

According to the second embodiment, the following advantageous effects are achieved.

In the angular rate sensor 200 according to the second embodiment, similarly to the first embodiment, structural constraints can be reduced while a Q value is increased by the annular first low thermal conductors 12, and overall performance improvement can be achieved.

In the angular rate sensor 200 according to the second embodiment, the second low thermal conductors 110 are provided such that heat transfer from the resonator 10 to the supports 20 via the couplings CP can be significantly reduced or prevented, and the Q value can be increased.

The remaining advantageous effects of the second embodiment are similar to those of the aforementioned first embodiment.

Third Embodiment

The configuration of an angular rate sensor 300 according to a third embodiment is now described with reference to FIG. 19. In the third embodiment, an example is described in which in addition to first low thermal conductors 12, end face layers 210 made of second materials are provided at the edge of a resonator 10. In the third embodiment, the same configurations as those of the first embodiment are denoted by the same reference numerals, and description thereof is omitted.

Figure 19A:
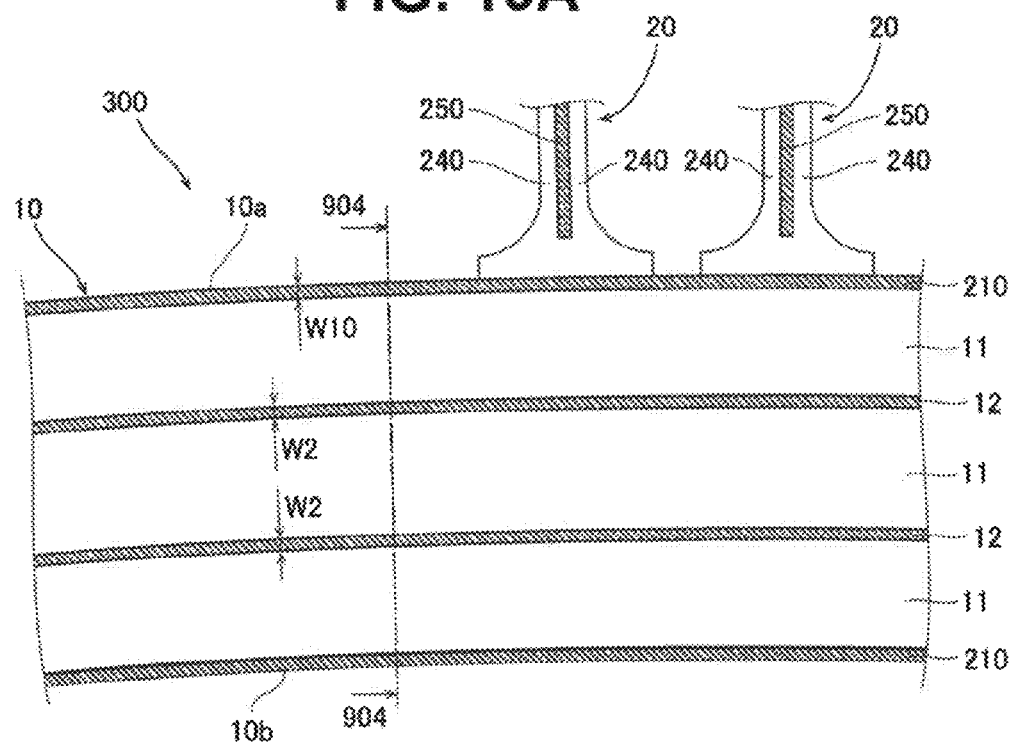
FIG. 19A is an enlarged plan view showing a resonator of an angular rate sensor according to a third embodiment.

As shown in FIG. 19(A), the angular rate sensor 300 includes, in a resonator 10, the first low thermal conductors 12 made of the second materials and sandwiched between first regions R1 and second regions R2 in a base material 11. Although not shown, the first low thermal conductors 12 are provided annularly over substantially the entire circumference of the resonator 10.

The angular rate sensor 300 according to the third embodiment includes the end face layers 210 made of the second materials on the outer peripheral surface 10a and the inner peripheral surface 10b of the resonator 10. In the third embodiment, an end face layer 210 may be provided on at least one of the outer peripheral surface 10a or the inner peripheral surface 10b. The configuration in which the end face layers 210 are provided on only one of the outer peripheral surface 10a and the inner peripheral surface 10b is not illustrated.

The end face layers 210 form the outer peripheral surface 10a (outer peripheral end face) and the inner peripheral surface 10b (inner peripheral end face) of the resonator 10. The end face layer 210 on the inner peripheral side and the end face layer 210 on the outer peripheral side each have a continuous annular shape over the entire circumference of the resonator 10. Therefore, the end face layers 210 define the outer shape of the resonator 10 in a plan view. The widths (radial thicknesses) W10 of the end face layers 210 are not particularly limited. For example, the widths W10 of the end face layers 210 are substantially equal to the widths W2 of the first low thermal conductors 12.

Figure 19B:
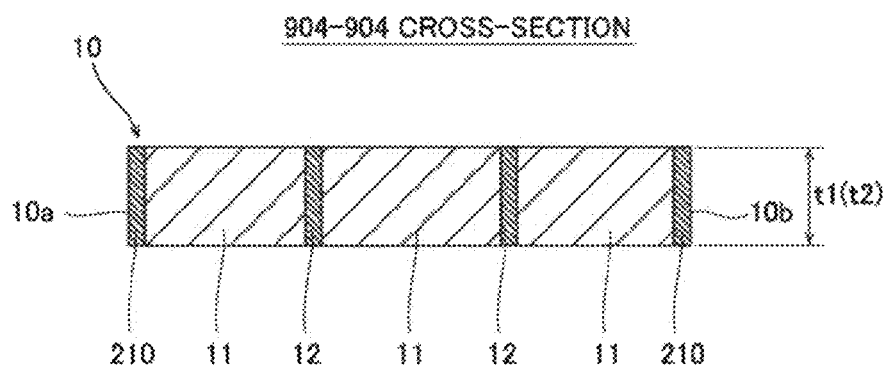
FIG. 19B is a sectional view taken along the line 904-904 in FIG. 19A.

The end face layers 210 are provided from one end to the other end in a thickness direction on the outer peripheral surface 10a and the inner peripheral surface 10b of the resonator 10, as shown in FIG. 19(B). That is, the radially outer peripheral side and the radially inner peripheral side of the base material 11 of the resonator 10 are covered with the end face layers 210.

In the example of FIG. 19, the first low thermal conductors 12 and the end face layers 210 are provided in the resonator 10, and third low thermal conductors 250 are further provided in supports 20. That is, the supports 20 include support base materials 240 made of first materials, and the third low thermal conductors 250 made of the second materials and sandwiched between the support base materials 240 from both sides in the width direction of the supports 20. Note that the longitudinal direction of the supports 20 is a direction along a path that connects the resonator 10 to a fixed portion 30 in a substrate 1, and the width direction of the supports 20 is a short-side direction orthogonal to the longitudinal direction.

In FIG. 19, one third low thermal conductor 250 is provided substantially at the center of each of the supports 20 in the width direction. The third low thermal conductors 250 extend along the longitudinal direction of the supports 20. Thus, the third low thermal conductors 250 are each sandwiched between the support base material 240 that forms one outer surface of the support 20 and the support base material 240 that forms the other outer surface of the support 20. The third low thermal conductors 250 penetrate the support base materials 240 in the thickness direction. The third low thermal conductors 250 may not penetrate the support base materials 240 in the thickness direction. The third low thermal conductors 250 extend along the supports 20 from the vicinities (not shown) of couplings between the supports 20 and the fixed portion 30 to the vicinities of couplings between the supports 20 and the resonator 10. In FIG. 19, the widths of the third low thermal conductors 250 are substantially equal to the widths of the support base materials 240 on both sides, but may be larger or smaller than the widths of the support base materials 240. A plurality of third low thermal conductors 250 may be provided in each of the supports 20.

The remaining configurations of the third embodiment are similar to those of the aforementioned first embodiment.

Method for Producing Angular Rate Sensor

A method for producing the angular rate sensor 300 according to the third embodiment is now described with reference to FIGS. 20 to 24. In particular, a method for forming the end face layers 210 is described. In sectional views shown in FIGS. 20 to 24, for convenience, the cross-sections of the supports 20 and the fixed portion 30 are omitted, and only the cross-section of a portion of the resonator 10 is shown.

Figure 20A:
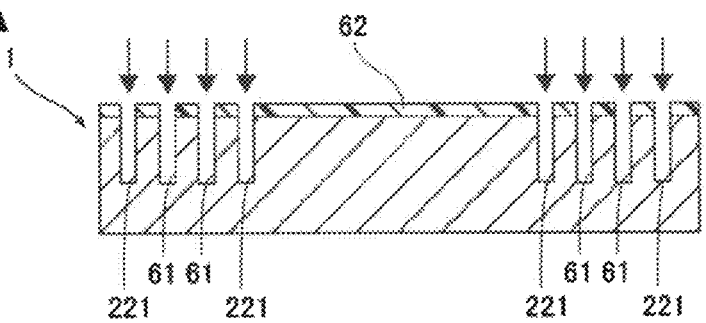
FIG. 20A is a schematic sectional view showing a step (1) of producing the angular rate sensor according to the third embodiment.
Figure 20B:
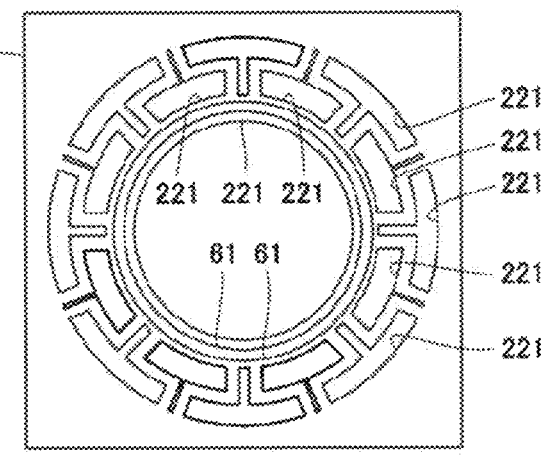
FIG. 20B is a schematic plan view corresponding to FIG. 20A.

First, as shown in FIG. 20(A), slits corresponding to the first low thermal conductors 12 and the end face layers 210 are formed in the flat plate-shaped substrate 1 made of the first material. That is, in addition to annular slits 61 corresponding to the first low thermal conductors 12, slits 221 corresponding to the end face layers 210 are formed. In FIG. 20(B), the slits 221 are formed in shapes corresponding to the inner peripheral surface 10b and the outer peripheral surface 10a of the resonator 10, the outer peripheral surfaces (outer shapes) of the supports 20, and the inner peripheral surface of the fixed portion 30 (the edges of spaces between the fixed portion 30 and the supports). The widths and depths of the slits 61 and the slits 221 may be the same as those in the first embodiment. Note that although slits (not shown) corresponding to the third low thermal conductors 250 are also formed, formation of the third low thermal conductors 250 is basically the same as that of the first low thermal conductors 12, and thus description thereof is omitted.

The slits 61 and the slits 221 are formed by forming a resist film 62 on the front surface of the substrate 1, forming a slit pattern by photolithography, and forming slits by etching. Each of the slits 61 and the slits 221 can be formed in the same steps, and thus the slit pattern for forming the slits 61 and the slits 221 can be provided in the same mask. Therefore, in the third embodiment, the relative position between the outer shapes (outlines) of the resonator 10, the supports 20, and the fixed portion 30 and the first low thermal conductors 12 becomes accurate in the same mask.

Figure 21:
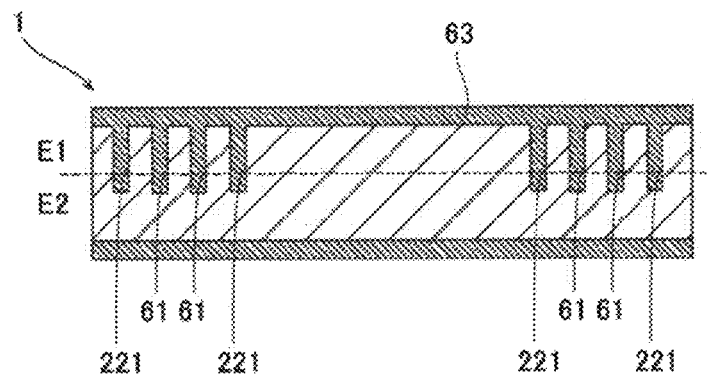
FIG. 21 is a schematic sectional view showing a step (2) of producing the angular rate sensor according to the third embodiment.

As shown in FIG. 21, similarly to the first embodiment, the slits 61 and 221 formed in the substrate 1 are filled with the second material to form a second material layer 63. The second material layer 63 is a silicon oxide film ($SiO_2$ film). The second material layer 63 is formed by thermal oxidation of silicon, for example, but may be formed by a CVD method, a sputtering method, or the like.

Figure 22:
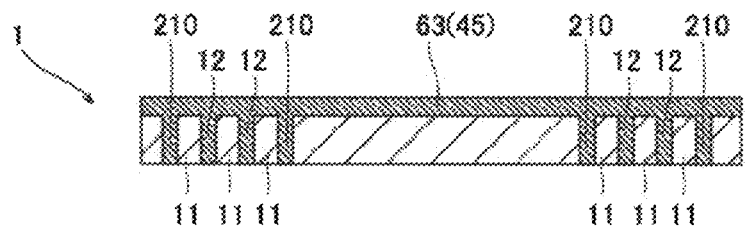
FIG. 22 is a schematic sectional view showing a step (3) of producing the angular rate sensor according to the third embodiment.

Next, similarly to the first embodiment, a lower side portion E2 of the substrate 1 excluding a range E1 shown in FIG. 21 is removed by machining (grinding). Consequently, as shown in FIG. 22, the first low thermal conductors 12 and the end face layers 210 are formed in the substrate 1.

Next, the same process of forming an insulating film 45 and wiring 40 (see FIG. 23) as that in the first embodiment is performed, and the insulating film 45 and the wiring 40 are formed with a predetermined wiring pattern on the substrate 1.

Figure 23A:
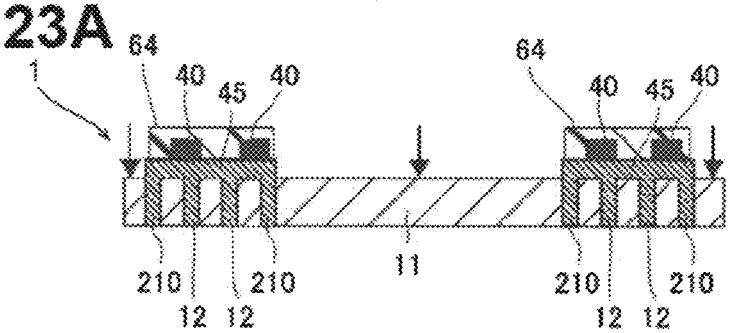
FIG. 23A is a schematic sectional view showing a step (4) of producing the angular rate sensor according to the third embodiment.
Figure 23B:
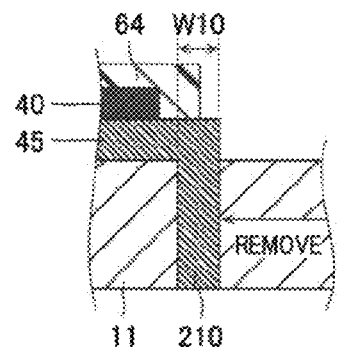
FIG. 23B is an enlarged sectional view showing an end face layer in FIG. 23A.

Next, the resonator 10, the supports 20, and the fixed portion 30 are formed in the substrate 1. That is, as shown in FIG. 23(A), a resist film 64 is formed on the front surface of the substrate 1, and the outer shape pattern of the resonator 10, the supports 20, and the fixed portion 30 is formed in the resist film 64 by photolithography. Then, the formed outer shape pattern is etched through.

In the etching, silicon can be selectively removed without removing the silicon oxide film ($SiO_2$). Therefore, in the third embodiment, the end face layers 210 corresponding to the outer shape of the resonator 10 are used as resists, and silicon is simply removed by etching as shown in FIG. 22(B) until side surfaces of the end face layers 210 are exposed such that the outer shape of the resonator 10 can be accurately formed. The resist film 64 only needs to be formed on the upper surfaces of the end face layers 210, and does not need to completely match the contour of the resonator 10. Therefore, the tolerance range of the mask position for forming the outer shape pattern of the resonator 10 in the resist film 64 can be ensured by the widths W10 of the end face layers 210.

Figure 24:
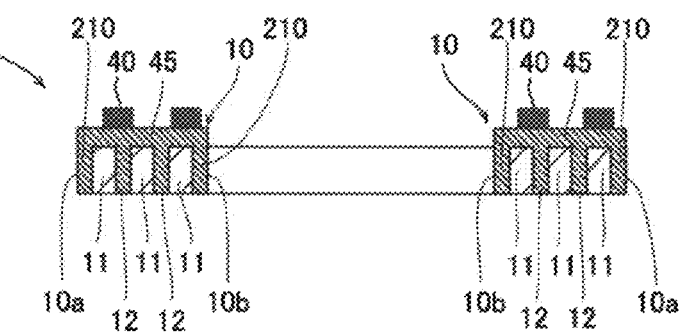
FIG. 24 is a schematic sectional view showing a step (5) of producing the angular rate sensor according to the third embodiment.

As a result of the etching, the end face layers 210 corresponding to the outer shape of the resonator 10, the supports 20, and the fixed portion 30 are exposed, and the resonator 10, the supports 20, and the fixed portion 30 are integrally formed in the substrate 1, as shown in FIG. 24. Subsequent packaging, etc. are the same as those in the first embodiment, and description thereof is omitted.

Advantageous Effects of Third Embodiment

According to the third embodiment, the following advantageous effects are achieved.

In the angular rate sensor 300 according to the third embodiment, similarly to the first embodiment, structural constraints can be reduced while a Q value is increased by the annular first low thermal conductors 12, and overall performance improvement can be achieved.

In the angular rate sensor 300 according to the third embodiment, when a temperature gradient is generated between the outer peripheral side and the inner peripheral side of the resonator 10, the end face layers 210 made of the second materials are provided on at least one of the outer peripheral surface 10a or the inner peripheral surface 10b on which a temperature difference is largest. Therefore, the end face layers 210 made of the second materials having a low thermal conductivity are arranged at locations (the outer peripheral surface 10a and the inner peripheral surface 10b) at which the temperature difference is largest, and thus as compared with the case in which the outer peripheral surface 10a and the inner peripheral surface 10b are made of the base material 11 of the first material, heat transfer in a radial direction can be effectively significantly reduced or prevented by the end face layers 210 made of the second materials. Furthermore, the relative positional accuracy between the outer shape of the resonator 10 and the first low thermal conductors 12 can be improved, and thus it is possible to improve the vibration characteristics of the angular rate sensor 300 and achieve performance improvement.

In the third embodiment, the end face layers 210 are provided on both the outer peripheral surface 10a and the inner peripheral surface 10b, and thus the positional accuracy of each of the outer peripheral surface 10a, the first low thermal conductors 12, and the inner peripheral surface 10b in the resonator 10 can be effectively improved. Note that even when the end face layers 210 are provided on only one of the outer peripheral surface 10a and the inner peripheral surface 10b, the relative positional accuracy between the end face layer 210 including either the outer peripheral surface 10a or the inner peripheral surface 10b of the resonator 10 and the first low thermal conductors 12 can be improved, and thus the positional accuracy of the first low thermal conductors 12 in the entire resonator 10 can be improved.

In the third embodiment, the third low thermal conductors 250 made of the second materials and sandwiched between the support base materials 240 from both sides in the width direction of the supports 20 are provided in the supports 20. Accordingly, when a temperature gradient is generated between one side and the other side of each of the supports 20 in the width direction due to vibrations of the supports 20 along with vibrations of the resonator 10, heat transfer from one side to the other side or from the other side to one side can be significantly reduced or prevented by the third low thermal conductor 250. Consequently, heat losses due to heat transfer not only in the resonator 10 but also in the supports 20 can be significantly reduced or prevented.

The remaining advantageous effects of the third embodiment are similar to those of the aforementioned first embodiment.

Fourth Embodiment

The configuration of an angular rate sensor 400 according to a fourth embodiment is now described with reference to FIG. 25. In the fourth embodiment, an example is described in which breaks 310 are provided in first low thermal conductors 12 unlike the first embodiment in which the continuous annular first low thermal conductors 12 are provided. In the fourth embodiment, the same configurations as those of the first embodiment are denoted by the same reference numerals, and description thereof is omitted.

Figure 25A:
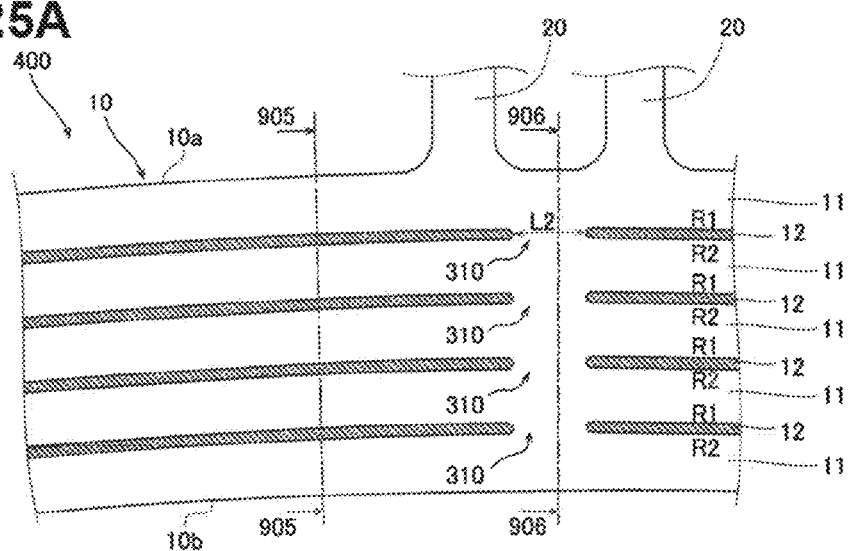
FIG. 25A is an enlarged plan view showing a resonator of an angular rate sensor according to a fourth embodiment.

As shown in FIG. 25(A), the angular rate sensor 400 includes, in a resonator 10, the first low thermal conductors 12 made of second materials and sandwiched between first regions R1 and second regions R2 in a base material 11. Although not shown, the first low thermal conductors 12 are provided annularly over substantially the entire circumference of the resonator 10.

In the angular rate sensor 400 according to the fourth embodiment, the first low thermal conductors 12 each include a break 310 in its portion in a circumferential direction. The base material 11 on the inner peripheral side of the first low thermal conductor 12 and the base material 11 on the outer peripheral side of the first low thermal conductor 12 are electrically connected to each other via a first material arranged in the break 310. In other words, in the break 310, a conductive portion made of the first material and penetrating the annular first low thermal conductor 12 in a radial direction is provided. A first region R1 on the outer peripheral side of the first low thermal conductor 12 and a second region R2 on the inner peripheral side of the first low thermal conductor 12 are connected to each other via the break 310.

The break 310 is provided in each of the first low thermal conductors 12. Therefore, as shown in FIG. 25(B), the base material 11 is divided into five regions 15 by four first low thermal conductors 12, but the five regions 15 are electrically connected to each other via the breaks 310, and have the same potential.

Each break 310 has a length L2 (see FIG. 25(A)). The break 310 has a higher thermal conductivity than the first low thermal conductor 12 (a portion of the second material), and serves as a passage through which heat generated due to vibrations of the resonator 10 can easily move. Therefore, from the viewpoint of reducing heat transfer while ensuring electrical connection, the length L2 of the break 310 is preferably sufficiently small with respect to the circumference of the first low thermal conductor 12, and it is preferably as small as possible within a range in which the regions 15 of the base material 11 can be electorally connected to each other. One break 310 is provided for one first low thermal conductor 12, for example. A plurality of breaks 310 may be provided, but the number of breaks 310 is preferably small.

Figure 25B:
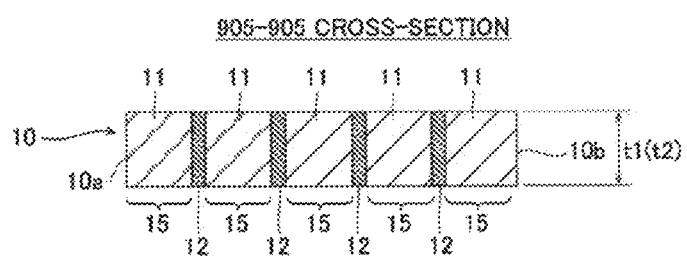
FIG. 25B is a sectional view taken along the line 905-905 in FIG. 25A.
Figure 25C:
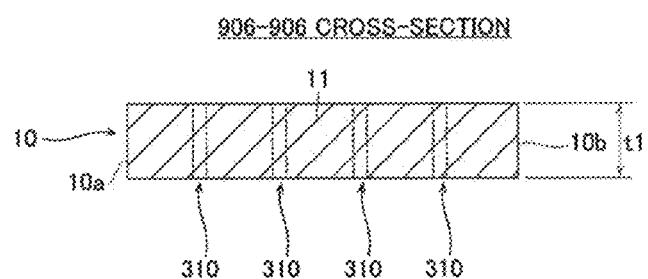
FIG. 25C is a sectional view taken along the line 906-906 in FIG. 25A.

As shown in FIG. 25(B), at positions other than the breaks 310, the first low thermal conductors 12 penetrate the base material 11 in a thickness direction, and divide the base material 11 into inner peripheral sides and outer peripheral sides. As shown in FIG. 25(C), in the breaks 310, the first low thermal conductors 12 are not provided, and the base material 11 having a thickness t1 is continuous. In the breaks 310, the first low thermal conductors 12 may be partially provided as long as the base material 11 on the inner peripheral side and the base material 11 on the outer peripheral side are connected to each other.

(Formation Position of Break)

The formation positions of the breaks 310 in the circumferential direction of the annular first low thermal conductors 12 are now described. The breaks 310 can be arranged at arbitrary positions (rotational positions) in the circumferential direction in the annular first low thermal conductors 12. For example, FIG. 25(A) shows an example in which the circumferential positions of the breaks 310 of the four first low thermal conductors 12 match each other. Therefore, four breaks 310 are linearly aligned in the radial direction.

As described above, the first low thermal conductors 12 made of the second materials are disconnected at the breaks 310, and thus the breaks 310 become passages through which heat generated due to vibrations of the resonator 10 can easily move. Therefore, when a plurality of first low thermal conductors 12 are provided in the radial direction of the resonator 10 (when the plurality of breaks 310 are provided), it is preferable not to linearly align the breaks 310 in order to lengthen a heat transfer path.

Figure 26:
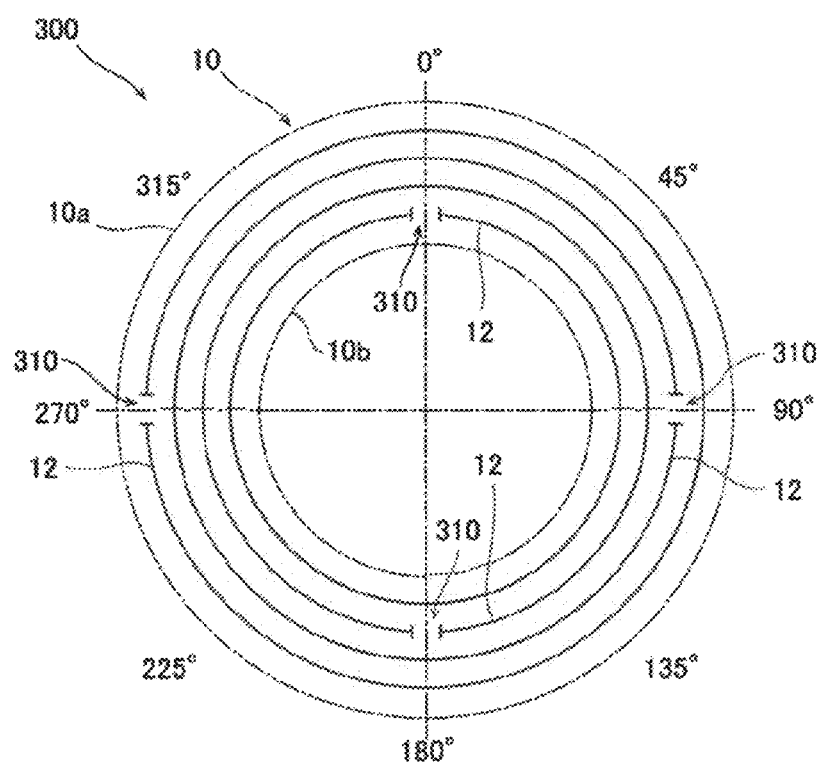
FIG. 26 is a schematic view showing a first example of the positions of breaks in first low thermal conductors.
Figure 27:
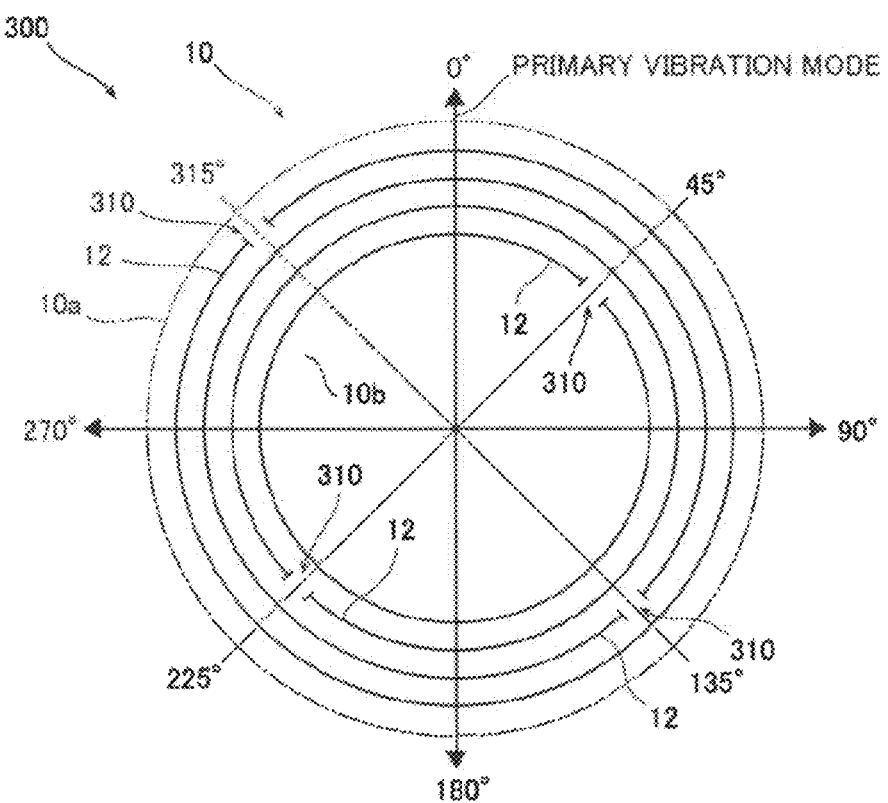
FIG. 27 is a schematic view showing a second example of the positions of the breaks in the first low thermal conductors.

Therefore, in examples of FIGS. 26 and 27, the formation positions of the breaks 310 of the plurality of first low thermal conductors 12 are different from each other in the circumferential direction. FIGS. 26 and 27 are schematic views showing the arrangement of the first low thermal conductors 12 and the breaks 310, and the inner peripheral surface 10b and the outer peripheral surface 10a of the resonator 10 are shown by two-dot chain lines. In the example of FIG. 26, assuming that a directly upper position in the figure is 0 degrees, the breaks 310 of the four first low thermal conductors 12 are respectively arranged at positions of 0 degrees, 90 degrees, 180 degrees, and 270 degrees. The innermost break 310 and the second innermost break 310 are provided at positions (0 degrees and 180 degrees) opposite to each other with respect to the center of the resonator 10. The outermost break 310 and the second outermost break 310 are provided at positions (90 degrees and 270 degrees) opposite to each other with respect to the center of the resonator 10.

Consequently, even in the configuration in which the breaks 310 are provided in the first low thermal conductors 12, the transfer path along which heat generated due to vibrations of the resonator 10 moves through the breaks 310 is lengthened.

Furthermore, the positions of the breaks 310 are preferably positions at which a temperature change is relatively small in consideration of the temperature change due to vibrations in the resonator 10. That is, as shown in FIG. 4, when the resonator 10 is driven in a primary vibration mode of cos 2θ, the positions of 0 degrees, 90 degrees, 180 degrees, and 270 degrees become antinodes of primary vibrations, and the amplitude is maximized. In this case, the positions of 45 degrees, 135 degrees, 225 degrees, and 315 degrees become nodes of the primary vibrations, and the amplitude is minimized. The temperature change due to the vibrations is caused by a compressive stress and a tensile stress due to the deformation, and thus as the amplitude is smaller (the deformation amount is smaller and the stress change is smaller), the temperature change is smaller.

Therefore, in the example shown in FIG. 27, the breaks 310 of the plurality of first low thermal conductors 12 are formed, in the circumferential direction, at the positions (45 degrees, 135 degrees, 225 degrees, and 315 degrees) of nodes in the primary vibration mode in which the resonator 10 is driven. That is, in the circumferential direction, the breaks 310 are provided at positions at which the amplitude at the time of driving the resonator 10 is minimized. Consequently, temperature differences of temperature gradients generated at the positions of the breaks 310 due to the vibrations are reduced, and the amount of heat transfer itself is reduced. Thus, the influence of heat transfer through the breaks 310 on a Q value is reduced as much as possible even when the breaks 310 are provided.

The remaining configurations of the fourth embodiment are similar to those of the aforementioned first embodiment.

Advantageous Effects of Fourth Embodiment

According to the fourth embodiment, the following advantageous effects are achieved.

In the angular rate sensor 400 according to the fourth embodiment, similarly to the first embodiment, structural constraints can be reduced while the Q value is increased by the annular first low thermal conductors 12, and overall performance improvement can be achieved.

In the fourth embodiment, the base material 11 on the inner peripheral side of the first low thermal conductor 12 and the base material 11 on the outer peripheral side of the first low thermal conductor 12 are electrically connected to each other via the break 310 provided in a portion of the first low thermal conductor 12 in the circumferential direction, and thus the first region R1 and the second region R2 can have the same potential. Consequently, even when the first low thermal conductor 12 is provided, it is possible to avoid generation of electrical noise due to a difference in potential between the first region R1 and the second region R2 that are electrically separated (have so-called float potentials).

In the configuration shown in FIGS. 26 and 27, the formation positions of the breaks 310 of the plurality of first low thermal conductors 12 are made different from each other in the circumferential direction such that the length of the heat transfer path can be increased. Thus, even when the breaks 310 are provided in the first low thermal conductors 12, the Q value can be increased.

The remaining advantageous effects of the fourth embodiment are similar to those of the aforementioned first embodiment.

Fifth Embodiment

Figure 29:
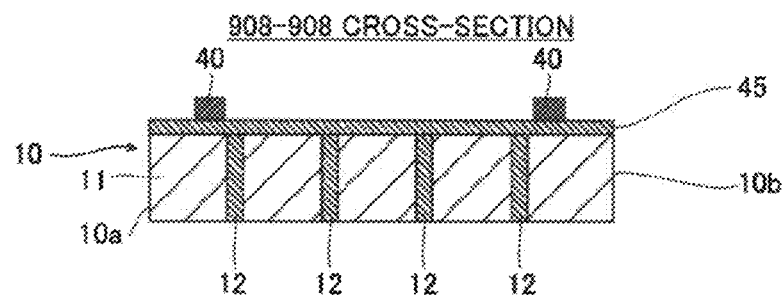
FIG. 29 is a sectional view taken along the line 908-908 in FIG. 28A.
Figure 30:
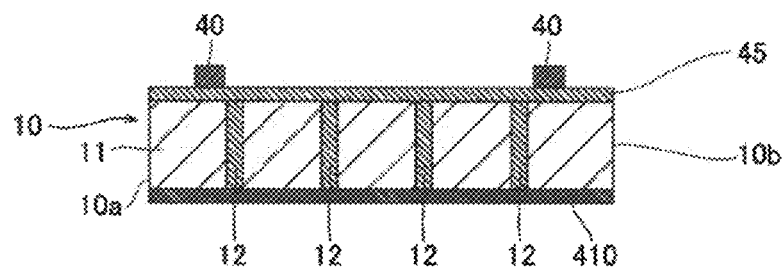
FIG. 30 is a schematic sectional view showing a modified example of the arrangement of a conductive layer in the angular rate sensor according to the fifth embodiment.

The configuration of an angular rate sensor 500 according to a fifth embodiment is now described with reference to FIGS. 28 to 30. In the fifth embodiment, an example is described in which electrical connection between a base material 11 on the inner side of a first low thermal conductor 12 and a base material 11 on the outer side of the first low thermal conductor 12 is ensured via a conductive layer 410 unlike the fourth embodiment in which the breaks 310 are provided in the first low thermal conductors 12. In the fifth embodiment, the same configurations as those of the first embodiment are denoted by the same reference numerals, and description thereof is omitted.

Figure 28A:
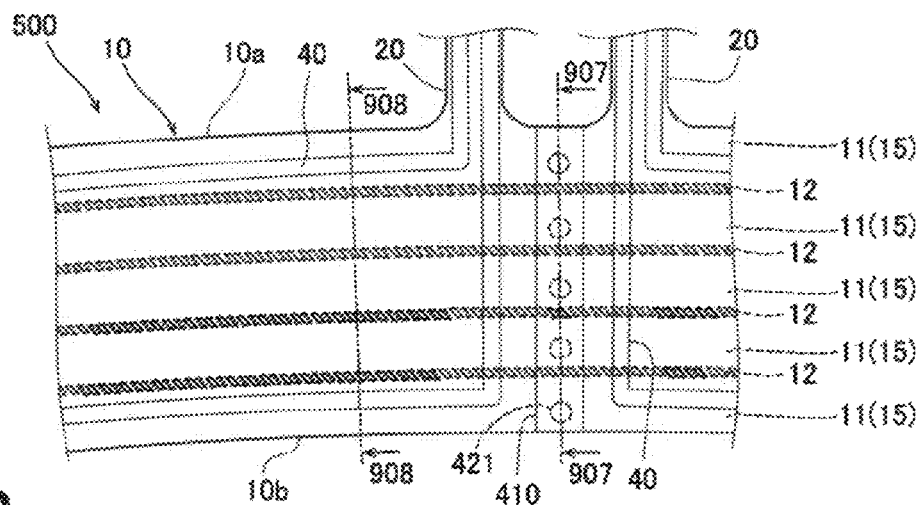
FIG. 28A is an enlarged plan view showing a resonator of an angular rate sensor according to a fifth embodiment.

As shown in FIG. 28(A), the angular rate sensor 500 includes, in a resonator 10, first low thermal conductors 12 made of second materials and sandwiched between first regions R1 and second regions R2 in the base material 11. Although not shown, the first low thermal conductors 12 are provided annularly over substantially the entire circumference of the resonator 10. The first low thermal conductors 12 are provided continuously over the entire circumference of the resonator 10 so as to divide the base material 11. Therefore, in the resonator 10, the base material 11 on the inner peripheral side and the base material 11 on the outer peripheral side are electrically separated from each other via the first low thermal conductor 12.

In the angular rate sensor 500 according to the fifth embodiment, the resonator 10 includes the conductive layer 410 that conducts electricity to the divided base material 11 on the front side of the resonator 10 with respect to the first low thermal conductors 12 and the base material 11. The conductive layer 410 is provided over substantially the entire width of the resonator 10 in a radial direction so as to cross the divided base material 11, for example. The conductive layer 410 is formed at a predetermined position in the circumferential direction of the resonator 10 by the same patterning as that for wiring 40, for example. That is, the wiring 40 and the conductive layer 410 can be collectively formed by patterning a common metal layer.

Figure 28B:
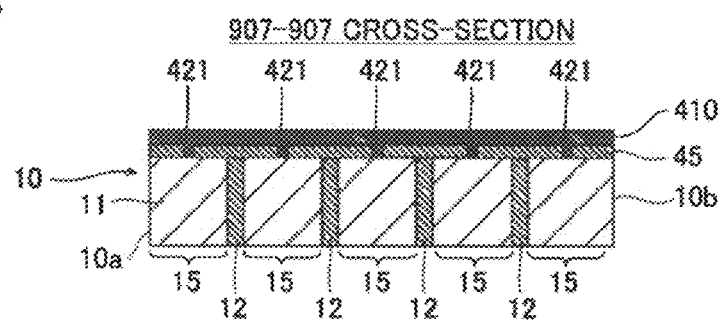
FIG. 28B is a sectional view taken along the line 907-907 in FIG. 28A.

Specifically, as shown in FIG. 28(B), an insulating film 45 is provided on the upper surface of the resonator 10 including the base material 11 and the first low thermal conductors 12, and the conductive layer 410 is provided on the front surface of the insulating film 45. That is, the conductive layer 410 is formed on the front surface of the insulating film 45 in common with the wiring 40 shown in FIG. 29. However, the conductive layer 410 is spaced apart from the wiring 40 and is electrically separated from the wiring 40. In FIG. 28(A), the conductive layer 410 extends in the radial direction at a position between two pieces of wiring 40 that respectively extend in the radial direction from two supports 20.

At the position at which the conductive layer 410 is formed, the insulating film 45 is provided with through-holes 421 that penetrate the insulating film 45 in a thickness direction by etching or the like. The through-holes 421 reach the upper surfaces of regions 15 of the base material 11 electrically separated by the first low thermal conductors 12. That is, in an example of FIG. 28(B), the base material 11 is separated into five regions 15 by four first low thermal conductors 12, and the through-holes 421 of the insulating film 45 are aligned in the radial direction in such a manner as to reach the upper surfaces of the five regions 15, respectively. The planar shapes of the through-holes 421 are not particularly limited but may be rectangular or circular, or the through-holes 421 may extend in the circumferential direction along the regions 15 of the base material 11 or may be annularly formed.

The conductive layer 410 is made of a conductor such as the same metal as the wiring 40 and is formed on the upper surface of the insulating film 45, and the through-holes 421 of the insulating film 45 are filled with the conductive layer 410. That is, the conductive layer 410 is formed after the through-holes 421 of the insulating film 45 are formed such that the conductive layer 410 is formed on the front surface of the insulating film 45 in such a manner that the through-holes 421 are filled with the conductive layer 410. Thus, the conductive layer 410 electrically connects the five regions 15 of the base material 11 to each other via the through-holes 421.

In the angular rate sensor 500 according to the fifth embodiment, electrical connection between the regions 15 electrically separated by the first low thermal conductors 12 in the base material 11 is ensured while the annularly continuous first low thermal conductors 12 are provided, unlike the configuration in which breaks 310 (see FIG. 25) are provided. No break 310 serving as a heat transfer path is provided, and thus a Q value is easily increased.

The conductive layer 410 and the wiring 40 need not be provided in the same layer of the resonator 10. In an example of FIG. 30, the conductive layer 410 and the wiring 40 are provided on different surfaces (the upper and lower surfaces) of the resonator 10. That is, in FIG. 30, the wiring 40 is provided on one surface, which is the upper surface of the resonator 10, via the insulating film 45. The conductive layer 410 is provided on the other surface, which is the lower surface of the resonator 10, and electrically connects the regions 15 of the base material 11 to each other. In the case of FIG. 30, the conductive layer 410 and the wiring 40 are electrically separated by the insulating film 45, and thus the conductive layer 410 may be formed directly on the other surface of the resonator 10 (base material 11). Furthermore, in the case of FIG. 30, the conductive layer 410 may be formed on substantially the entire other surface of the resonator 10, for example.

The remaining configurations of the fifth embodiment are similar to those of the aforementioned first embodiment.

Advantageous Effects of Fifth Embodiment

According to the fifth embodiment, the following advantageous effects are achieved.

In the angular rate sensor 500 according to the fifth embodiment, similarly to the first embodiment, structural constraints can be reduced while the Q value is increased by the annular first low thermal conductors 12, and overall performance improvement can be achieved.

In the angular rate sensor 500 according to the fifth embodiment, the conductive layer 410 that conducts electricity to the base material 11 divided by the first low thermal conductors 12 is provided on the front side or the back side of the resonator 10, and thus even when the first regions R1 and the second regions R2 of the base material 11 are electrically separated by the first low thermal conductors 12, the first regions R1 and the second regions R2 can have the same potential. Consequently, even when the first low thermal conductors 12 are provided, it is possible to avoid generation of electrical noise due to a difference in potential between the first regions R1 and the second regions R2.

The remaining advantageous effects of the fifth embodiment are similar to those of the aforementioned first embodiment.

Sixth Embodiment

The configuration of an angular rate sensor 600 according to a sixth embodiment is now described with reference to FIGS. 31 to 34. In the sixth embodiment, an example is described in which in addition to the configuration according to the aforementioned first embodiment, fourth low thermal conductors 510 are further provided. In the sixth embodiment, the same configurations as those of the first embodiment are denoted by the same reference numerals, and description thereof is omitted.

Figure 31:
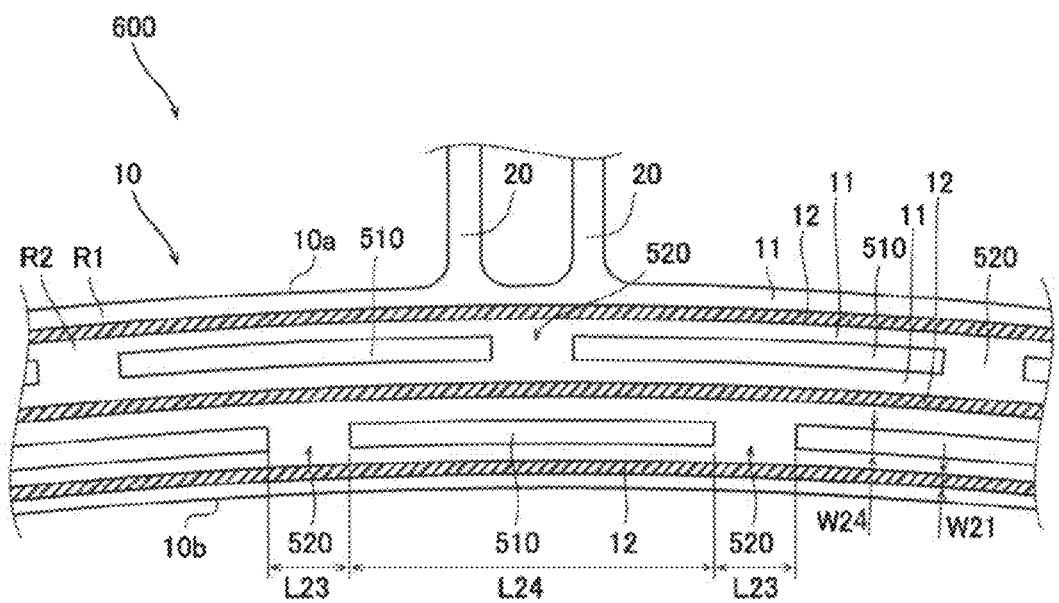
FIG. 31 is an enlarged plan view showing a resonator of an angular rate sensor according to a sixth embodiment.

As shown in FIG. 31, the angular rate sensor 600 includes, in a resonator 10, first low thermal conductors 12 made of second materials and sandwiched between first regions R1 and second regions R2 in a base material 11. The first low thermal conductors 12 are provided annularly over substantially the entire circumference of the resonator 10. The first low thermal conductors 12 are provided continuously over the entire circumference of the resonator 10 so as to divide the base material 11.

In the angular rate sensor 600 according to the sixth embodiment, the resonator 10 further includes the fourth low thermal conductors 510 including non-through grooves or through-holes formed in the resonator 10. The fourth low thermal conductors 510 each have a lower thermal conductivity than the base material 11 due to a void including a groove or a through-hole in the resonator 10. For heat that passes through the fourth low thermal conductors 510, gas such as air that exists in the void serves as a heat conduction medium. For example, the thermal conductivity of the air (near room temperature) is about 0.0241 [W/(m·K)]. Therefore, the thermal conductivity of each of the fourth low thermal conductors 510 is lower than the thermal conductivity of the base material 11 made of silicon as a first material, for example, and is lower than the thermal conductivity of each of the first low thermal conductors 12 made of silicon oxides as the second materials.

Figure 32A:
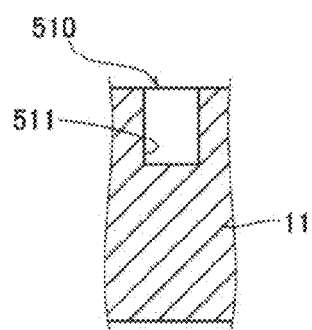
FIGS. 32A to 32D are diagrams showing examples of the cross-sectional shape of a fourth low thermal conductor shown in FIG. 31.
Figure 32B:
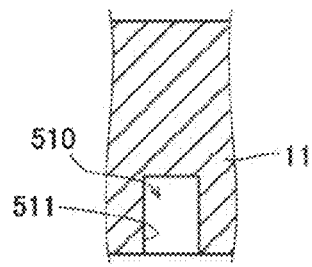
Figure 32C:
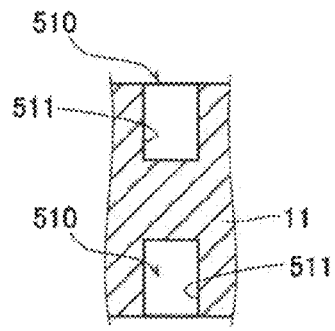
Figure 32D:
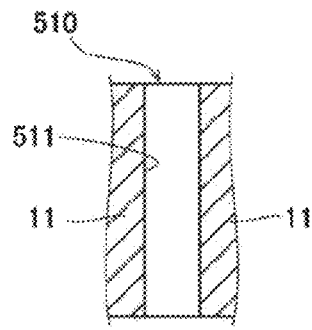

The fourth low thermal conductors 510 can include non-through grooves each having a concave shape in the thickness direction of the resonator 10, as shown in FIGS. 32(A) to 32(C). Furthermore, as shown in FIG. 32(D), the fourth low thermal conductors 510 can include through-holes that penetrate the resonator 10 in the thickness direction. In FIG. 32(A), the fourth low thermal conductors 510 are each provided in such a manner as to have a concave cross-section on one surface (the upper surface) of the resonator 10. In FIG. 32(B), the fourth low thermal conductors 510 are each provided in such a manner as to have a concave cross-section on the other surface (the lower surface) of the resonator 10. In FIG. 32(C), the fourth low thermal conductors 510 are provided in such a manner as to have concave cross-sections on both one surface (the upper surface) and the other surface (the lower surface) of the resonator 10. In FIG. 32(D), the fourth low thermal conductors 510 penetrate the resonator 10 from one surface (the upper surface) to the other surface (the lower surface) in the thickness direction, and open onto one surface (the upper surface) and the other surface (the lower surface).

In FIG. 31, although the entirety is not illustrated, a plurality of fourth low thermal conductors 510 are provided in such a manner as to be aligned over substantially the entire circumference of the resonator 10. In an example of FIG. 31, the fourth low thermal conductors 510 each have a length L24 in a circumferential direction and are arranged at regular intervals over substantially the entire circumference of the resonator 10 with an interval L23 therebetween in the circumferential direction. A portion 520 between the fourth low thermal conductors 510 adjacent to each other in the circumferential direction is a portion of the base material 11 made of the first material.

In the example of FIG. 31, a plurality of (two) fourth low thermal conductors 510 are provided in the radial direction of the resonator 10. That is, two rows of fourth low thermal conductors 510 circumferentially arranged over substantially the entire circumference of the resonator 10 are provided concentrically at positions shifted in the radial direction. In the row of the fourth low thermal conductors 510 on the radially outer side and the row of the fourth low thermal conductors 510 on the radially inner side, the positions of portions 520 are shifted in the circumferential direction. The portions 520 serve as a transfer path for heat that bypasses the fourth low thermal conductors 510. Therefore, the positions of the portions 520 in the circumferential direction are shifted such that the heat transfer path becomes longer, and a Q value can be increased accordingly.

In the sixth embodiment, the fourth low thermal conductors 510 and the first low thermal conductors 12 are arranged in the radial direction of the resonator 10. In FIG. 31, the first low thermal conductors 12 are respectively provided at three locations at the outer side, the center, and the inner side of the resonator 10 in the radial direction. Two concentric rows of fourth low thermal conductors 510 and three annular first low thermal conductors 12 are alternately arranged in the radial direction. The width W24 of each of the fourth low thermal conductors 510 may be the same as the width W21 of each of the first low thermal conductors 12, or one of the width W24 of the fourth low thermal conductor 510 and the width W21 of the first low thermal conductor 12 may be larger than the other of the width W24 and the width W21.

In the example of FIG. 31, the base material 11 is interposed between the fourth low thermal conductors 510 and the first low thermal conductors 12 in the radial direction. Therefore, the fourth low thermal conductors 510 include grooves or through-holes formed in the base material 11 of the resonator 10. In other words, as shown in FIGS. 32(A) to 32(D), the inner surfaces 511 of the grooves or the through-holes of the fourth low thermal conductors 510 are formed by surfaces of the base material 11.

Figure 33A:
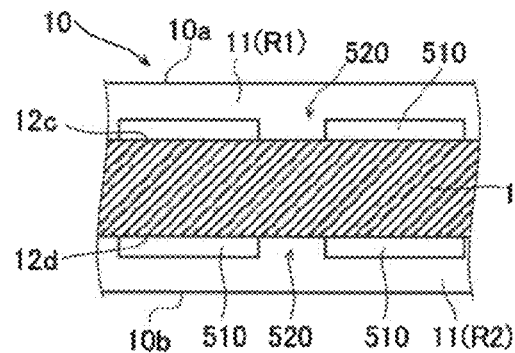
FIG. 33A is an enlarged plan view FIG. 33A and an enlarged sectional view FIG. 33B showing a first modified example of the angular rate sensor in FIG. 31.
Figure 33B:
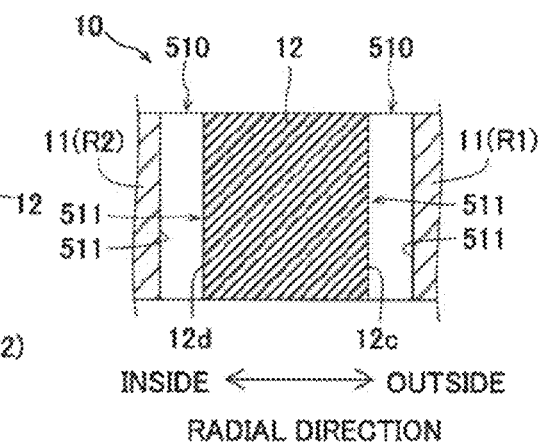

As shown in FIG. 33, the fourth low thermal conductors 510 and the first low thermal conductors 12 may be adjacent to each other without the base material 11 interposed therebetween. FIG. 33(A) is a plan view schematically showing a portion of the resonator 10, and the resonator 10 is linearly shown for convenience. FIG. 33(B) is a sectional view of the resonator 10 along the radial direction and the thickness direction. In an example of FIG. 33, the fourth low thermal conductors 510 are provided on the radially outer side and the radially inner side, respectively, and the first low thermal conductor 12 is arranged between the fourth low thermal conductors 510. The outer peripheral surface 12c on the radially outer side of the first low thermal conductor 12 is exposed to the inside of the outer fourth low thermal conductor 510, and forms the inner surface 511 of the fourth low thermal conductor 510. The inner peripheral surface 12d on the radially inner side of the first low thermal conductor 12 is exposed to the inside of the fourth low thermal conductor 510, and forms the inner surface 511 of the fourth low thermal conductor 510.

In an example of FIG. 34, the annular first low thermal conductors 12 penetrate the fourth low thermal conductors 510. Consequently, the resonator 10 includes fourth low thermal conductors 510a radially outward of the first low thermal conductors 12 and fourth low thermal conductors 510b radially inward of the first low thermal conductors 12.

Figure 34A:
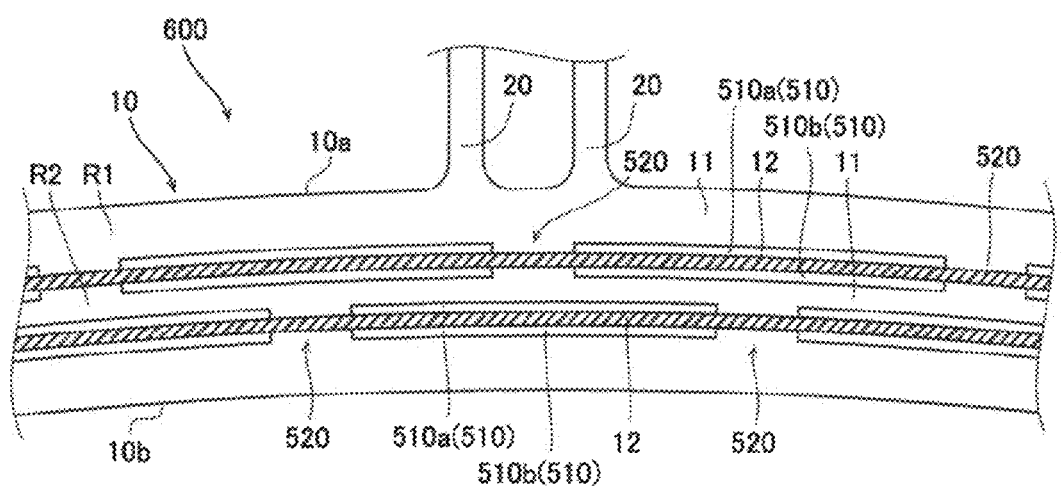
FIG. 34A is an enlarged plan view FIG. 34A showing a second modified example of the angular rate sensor in FIG. 31, a sectional view FIG. 34B of a fourth low thermal conductor, and a sectional view FIG. 34C of a portion between adjacent fourth low thermal conductors.
Figure 34B:
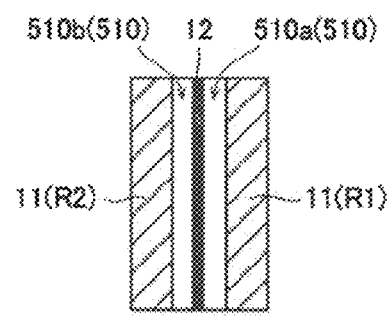
Figure 34C:
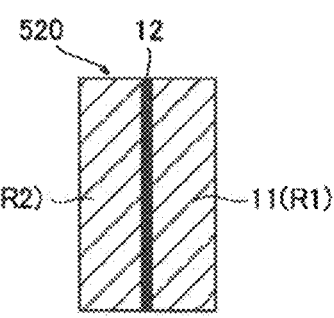

In an example of FIG. 34(A), the first low thermal conductors 12 are also provided in the portions 520 between the fourth low thermal conductors 510 that are adjacent to each other in the circumferential direction. Therefore, in FIG. 34(B) showing a cross-section at a location at which the fourth low thermal conductor 510 is formed, the first low thermal conductor 12 is formed in such a manner as to pass between the fourth low thermal conductors 510a and 510b each including a through-hole. In FIG. 34(C) showing a cross-section at the portion 520 between the fourth low thermal conductors 510 adjacent to each other in the circumferential direction, the first low thermal conductor 12 is provided in such a manner as to divide the base material 11 into the radially inner side and the radially outer side.

The example of FIG. 33 is different from the example of FIG. 34 only in that the radial width of the first low thermal conductor 12 and the radial width of the fourth low thermal conductor 510 are different, and the example of FIG. 33 can be considered to be structurally equivalent to the example of FIG. 34 in that the fourth low thermal conductor 510 is divided into the inner side and the outer side by the first low thermal conductor 12. In the examples of FIG. 33 and FIG. 34, at the location at which the fourth low thermal conductor 510 is formed, the first low thermal conductor 12 is sandwiched between the first region R1 and the second region R2 in the base material 11 via the fourth low thermal conductor 510. In the portion 520 between the adjacent fourth low thermal conductors 510, the first low thermal conductor 12 is sandwiched in direct contact with the first region R1 and the second region R2 between the first region R1 and the second region R2 in the base material 11.

The remaining configurations of the sixth embodiment are similar to those of the aforementioned first embodiment.

Advantageous Effects of Sixth Embodiment

According to the sixth embodiment, the following advantageous effects are achieved.

In the angular rate sensor 600 according to the sixth embodiment, similarly to the first embodiment, structural constraints can be reduced while the Q value is increased by the annular first low thermal conductors 12, and overall performance improvement can be achieved.

In the angular rate sensor 600 according to the sixth embodiment, heat transfer can be significantly reduced or prevented by the non-through grooves or the through-holes of the fourth low thermal conductors 510. Therefore, the Q value can be more effectively increased by providing the fourth low thermal conductors 510 in addition to the first low thermal conductors 12.

In the angular rate sensor 600 according to the sixth embodiment, even when a temperature gradient in the radial direction is generated due to vibrations of the resonator 10, heat transfer in the radial direction can be effectively significantly reduced or prevented by the fourth low thermal conductors 510 and the first low thermal conductors 12 aligned in the radial direction.

The remaining advantageous effects of the sixth embodiment are similar to those of the aforementioned first embodiment.

Seventh Embodiment

The configuration of an angular rate sensor 700 according to a seventh embodiment is now described with reference to FIGS. 35 and 36. In the seventh embodiment, an example is described in which fourth low thermal conductors 510 and first low thermal conductors 12 are aligned in a circumferential direction. In the seventh embodiment, the same configurations as those of the first embodiment are denoted by the same reference numerals, and description thereof is omitted.

Figure 35:
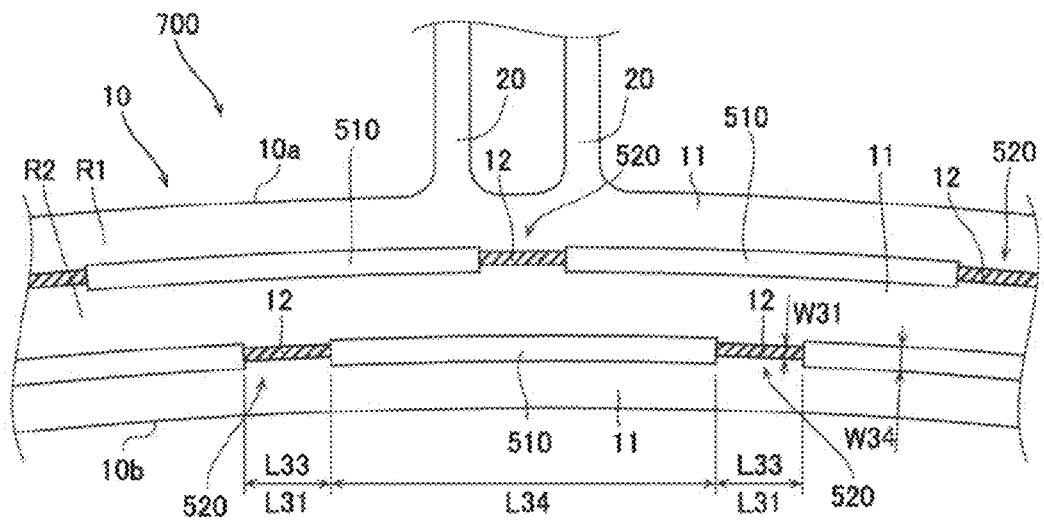
FIG. 35 is an enlarged plan view showing a resonator of an angular rate sensor according to a seventh embodiment.

As shown in FIG. 35, in the angular rate sensor 700 according to the seventh embodiment, the fourth low thermal conductors 510 include through-holes that penetrate a resonator 10 in a thickness direction, and the fourth low thermal conductors 510 and the first low thermal conductors 12 are arranged in the circumferential direction. The fourth low thermal conductors 510 may be non-through grooves.

Although the entirety is not illustrated, a plurality of fourth low thermal conductors 510 are aligned over substantially the entire circumference of the resonator 10. In an example of FIG. 35, the fourth low thermal conductors 510 each have a length L34 in the circumferential direction and are arranged at regular intervals over substantially the entire circumference of the resonator 10 with an interval L33 therebetween in the circumferential direction. In the seventh embodiment, each of the first low thermal conductors 12 is provided between the fourth low thermal conductors 510 in the circumferential direction. That is, the first low thermal conductors 12 made of second materials are arranged in portions 520 between the adjacent fourth low thermal conductors 510.

Although the entirety is not illustrated, a plurality of first low thermal conductors 12 are aligned over substantially the entire circumference of the resonator 10. Specifically, the first low thermal conductors 12 are provided over substantially the entire circumference of the resonator 10 except for the through-holes (the fourth low thermal conductors 510). That is, in the example of FIG. 35, the first low thermal conductors 12 and the fourth low thermal conductors 510 are alternately aligned in the circumferential direction, and rows of first low thermal conductors 12 and fourth low thermal conductors 510 aligned in the circumferential direction are formed over substantially the entire circumference of the resonator 10. In the example of FIG. 35, a plurality of (two) rows of first low thermal conductors 12 and fourth low thermal conductors 510 that extend in the circumferential direction are provided concentrically in a radial direction. In each row, a plurality of first low thermal conductors 12 are aligned at intervals corresponding to the lengths L34 of the fourth low thermal conductors 510 in the circumferential direction, and as a whole are formed over substantially the entire circumference of the resonator 10 as a whole. In the relationship between the inner row and the outer row, the first low thermal conductors 12 and the fourth low thermal conductors 510 are aligned in the radial direction.

The first low thermal conductors 12 each have a length L31 in the circumferential direction. In the example of FIG. 35, the length L31 of the first low thermal conductor 12 is equal to the length L33 of the portion 520 between the fourth low thermal conductors 510 adjacent to each other in the circumferential direction. That is, the first low thermal conductor 12 connects the end faces of the fourth low thermal conductors 510 adjacent to each other in the circumferential direction. Therefore, each of the rows of fourth low thermal conductors 510 and first low thermal conductors 12 aligned in the circumferential direction divides a base material 11 into the radially inner side and the radially outer side. The portions 520 serve as a transfer path for heat that bypasses the fourth low thermal conductors 510, and thus the first low thermal conductors 12 are arranged in the portions 520, which are a heat passage, such that heat transfer in the radial direction is effectively significantly reduced or prevented.

In the example of FIG. 35, the width W34 of the fourth low thermal conductor 510 in the radial direction is larger than the width W31 of the first low thermal conductor 12 in the radial direction. The width W34 of the fourth low thermal conductor 510 may be equal to the width W31 of the first low thermal conductor 12, or the width W34 of the fourth low thermal conductor 510 may be smaller than the width W31 of the first low thermal conductor 12.

In the example of FIG. 35, the length L34 of the fourth low thermal conductor 510 in the circumferential direction is larger than the length L31 of the first low thermal conductor 12 in the circumferential direction. The length L34 of the fourth low thermal conductor 510 may be equal to the length L31 of the first low thermal conductor 12, and the length L34 of the fourth low thermal conductor 510 may be smaller than the length L31 of the first low thermal conductor 12.

Figure 36A:
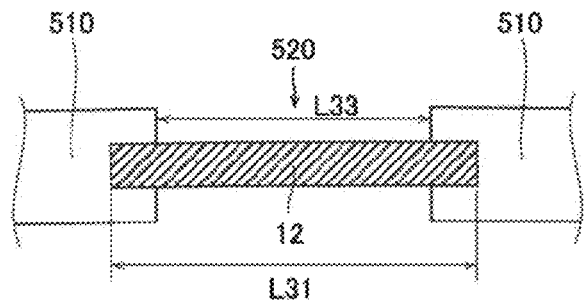
FIGS. 36A and 36B are diagrams showing modified examples of the length of a first low thermal conductor in FIG. 35.

As shown in FIG. 36(A), the length L31 of the first low thermal conductor 12 may be longer than the length L33 of the portion 520 between the fourth low thermal conductors 510 adjacent to each other in the circumferential direction. That is, in the circumferential direction, ends of the first low thermal conductor 12 may protrude into the fourth low thermal conductors 510. Although depending on a manufacturing process, the structure of the resonator 10 as shown in FIGS. 35 and 36 can be formed by forming the first low thermal conductor 12 in the base material 11 and then patterning and etching the formation location of the fourth low thermal conductor 510. At this time, when the length L31 of the first low thermal conductor 12 is larger than the length L33 as shown in FIG. 36(A), a large tolerance in patterning the formation location of the fourth low thermal conductor 510 can be ensured, and thus manufacturing of the angular rate sensor 700 can be facilitated.

Figure 36B:
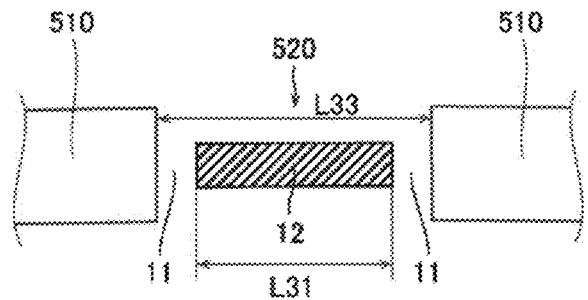

As shown in FIG. 36(B), the length L31 of the first low thermal conductor 12 may be smaller than the length L33 of the portion 520 between the fourth low thermal conductors 510 adjacent to each other in the circumferential direction. That is, the base material 11 may be interposed between the first low thermal conductor 12 and the fourth low thermal conductor 510 in the circumferential direction.

The remaining configurations of the seventh embodiment are similar to those of the aforementioned sixth embodiment.

Advantageous Effects of Seventh Embodiment

According to the seventh embodiment, the following advantageous effects are achieved.

In the angular rate sensor 700 according to the seventh embodiment, similarly to the first embodiment, structural constraints can be reduced while a Q value is increased by the annular first low thermal conductors 12, and overall performance improvement can be achieved.

In the angular rate sensor 700 according to the seventh embodiment, heat transfer can be effectively significantly reduced or prevented by the through-holes at the locations at which the fourth low thermal conductors 510 are formed. In the portions (portions 520) in which the fourth low thermal conductors 510 are not formed in the circumferential direction, heat transfer can be significantly reduced or prevented by the first low thermal conductors 12. Accordingly, even when the first low thermal conductors 12 and the fourth low thermal conductors 510 are not formed in a continuous annular shape over the entire circumference of the resonator 10 in the circumferential direction, heat transfer can be significantly reduced or prevented, and thus the structural constraints can be effectively reduced while the Q value is increased.

In particular, when the fourth low thermal conductors 510 include through-holes, the fourth low thermal conductors 510 cannot be formed in a continuous annular shape due to the structural constraints. Therefore, in the seventh embodiment, the fourth low thermal conductors 510 and the first low thermal conductors 12 are arranged in the circumferential direction of the resonator 10, and thus heat transfer can be significantly reduced or prevented by providing the first low thermal conductors 12 in the portions (portions 520) in which the fourth low thermal conductors 510 are not formed. Thus, it is possible to more effectively increase the Q value while satisfying the structural constraints.

In the angular rate sensor 700 according to the seventh embodiment, the plurality of fourth low thermal conductors 510 are aligned over substantially the entire circumference of the resonator 10 such that heat transfer can be effectively significantly reduced or prevented over the entire circumference of the resonator 10. Furthermore, the first low thermal conductors 12 are provided between the fourth low thermal conductors 510 such that transfer of heat that passes between the fourth low thermal conductors 510 can be significantly reduced or prevented. Consequently, the Q value can be more effectively increased.

The remaining advantageous effects of the seventh embodiment are similar to those of the aforementioned sixth embodiment.

Eighth Embodiment

The configuration of an angular rate sensor 800 according to an eighth embodiment is now described with reference to FIGS. 37 and 38. In the eighth embodiment, an example is described in which fourth low thermal conductors 510 and first low thermal conductors 12 are aligned in the thickness direction of a resonator unlike the sixth and seventh embodiments. In the eighth embodiment, the same configurations as those of the first embodiment are denoted by the same reference numerals, and description thereof is omitted.

FIG. 37 is schematic views (A) to (F) of a cross-section of a resonator 10 along a radial direction and the thickness direction as viewed in a circumferential direction. In the angular rate sensor 800 according to the eighth embodiment, the fourth low thermal conductors 510 each include a groove having a concave shape in the thickness direction of the resonator 10, and the fourth low thermal conductors 510 and the first low thermal conductors 12 are arranged in the thickness direction.

As shown in FIGS. 37(A) to 37(C), the fourth low thermal conductor 510 includes a non-through groove having a concave shape in the thickness direction of the resonator 10. In FIG. 37(A), the fourth low thermal conductor 510 is provided in such a manner as to have a concave cross-section on one surface (the upper surface) of the resonator 10. In FIG. 37(B), the fourth low thermal conductor 510 is provided in such a manner as to have a concave cross-section on the other surface (the lower surface) of the resonator 10. In FIGS. 37(A) and 37(B), the surface of the resonator 10 on which the fourth low thermal conductor 510 is not formed is flat. In FIG. 37(C), the fourth low thermal conductors 510 are provided in such a manner as to have concave cross-sections on both one surface (the upper surface) and the other surface (the lower surface) of the resonator 10. In the cross-sections, the fourth low thermal conductors 510 each have a rectangular shape. The cross-sectional shape of each of the fourth low thermal conductors 510 is not limited to a rectangle, but is arbitrary. It may be a triangular shape, a U-shape, or an arcuate shape, for example.

The resonator 10 includes connections 710 adjacent to the fourth low thermal conductors 510 in the thickness direction. The connections 710 are portions that connect a base material 11 on the radially inner side with respect to the fourth low thermal conductors 510 to a base material 11 on the radially outer side with respect to the fourth low thermal conductors 510. In examples of FIGS. 37(A) and 37(B), the connection 710 is a portion between the fourth low thermal conductor 510 and a surface on the side opposite to the fourth low thermal conductor 510. In an example of FIG. 37(C), the connection 710 is a portion between the fourth low thermal conductors 510 provided on both surfaces of the resonator 10.

In the eighth embodiment, the first low thermal conductors 12 are arranged at the same positions in the radial direction and the circumferential direction as the fourth low thermal conductors 510, and are provided at least in regions in which the fourth low thermal conductors 510 are not formed in the thickness direction of the resonator 10. That is, the first low thermal conductors 12 are provided at least in the connections 710. Thus, the fourth low thermal conductors 510 and the first low thermal conductors 12 are arranged in the thickness direction.

In the examples of FIGS. 37(A) to 37(C), the first low thermal conductor 12 is provided over the entire length of the connection 710 in the thickness direction. An end(s) of the first low thermal conductor 12 in the thickness direction is exposed to the inner bottom surface(s) of the fourth low thermal conductor(s) 510.

In FIG. 37, the width W41 of each of the first low thermal conductors 12 in the radial direction is smaller than the width W44 of each of the inner bottom surfaces of the fourth low thermal conductors 510 in the radial direction. The width W41 of the first low thermal conductor 12 may be equal to the width W44 of the inner bottom surface of the fourth low thermal conductor 510. That is, the entirety of the connection 710 may be the first low thermal conductor 12.

In each cross-section shown in FIG. 37, the connection 710 serves as a transfer path for heat that bypasses the fourth low thermal conductor(s) 510. Therefore, the first low thermal conductor 12 is arranged in the connection 710, which is a heat passage, such that heat transfer in the radial direction is effectively significantly reduced or prevented.

When the examples of FIGS. 37(A) to 37(C) are compared with each other, one surface or the other surface of the resonator 10 can be flat in the examples of FIGS. 37(A) and 37(B), and thus wiring 40 (see FIG. 5) can be easily formed. In the example of FIG. 37(C), the fourth low thermal conductors 510 can be provided vertically symmetrically in the thickness direction of the resonator 10, and thus the symmetry of the resonator 10 can be easily ensured, and generation of an unintended vibration component can be significantly reduced or prevented. Furthermore, in the example of FIG. 37(C), it is easy to ensure the symmetry of the shape change of the resonator 10 due to heat generation, and it is possible to significantly reduce or prevent the distortion of the resonator 10 due to heat generation.

In examples of FIGS. 37(D) to 37(F), the first low thermal conductor 12 is formed in the connection 710 and protrudes into the fourth low thermal conductor(s) 510. In FIGS. 37(D) to 37(F), the fourth low thermal conductors 510 are formed on both one surface (the upper surface) and the other surface (the lower surface) of the resonator 10, and the first low thermal conductor 12 extends in the thickness direction so as to protrude into either or both of the fourth low thermal conductors 510.

In FIG. 37(D), the first low thermal conductor 12 protrudes into both the fourth low thermal conductors 510. The first low thermal conductor 12 extends from one surface (the upper surface) of the resonator 10 to the other surface (the lower surface). That is, the thickness of the first low thermal conductor 12 is equal to the thickness of the resonator 10 (base material 11). In FIGS. 37(E) and 37(F), the first low thermal conductor 12 protrudes into one fourth low thermal conductor 510.

The structure of the resonator 10 as shown in FIGS. 37(A) to 37(C) can be formed by forming the fourth low thermal conductor(s) 510 by etching after forming the first low thermal conductor 12 in the base material 11, and removing, by etching, the first low thermal conductor 12 that remains in the fourth low thermal conductor(s) 510. Therefore, in the configuration in which the first low thermal conductor 12 protrudes into the fourth low thermal conductor(s) 510 as shown in FIGS. 37(D) to 37(F), a part or all of a process of removing, by etching, the first low thermal conductor 12 that remains in the fourth low thermal conductor(s) 510 can be omitted, and thus manufacturing of the angular rate sensor 700 can be facilitated.

The fourth low thermal conductors 510 are voids including non-through grooves, and thus the rigidity of the resonator 10 tends to decrease as compared with the case in which the fourth low thermal conductors 510 are not provided (the case in which no void is formed). When the first low thermal conductor 12 is formed as shown in FIGS. 37(D) to 37(F), the first low thermal conductor 12 provides reinforcement such that the rigidity of the resonator 10 can be easily ensured.

In the eighth embodiment, the fourth low thermal conductors 510 include non-through grooves instead of through-holes, and thus the fourth low thermal conductors 510 can be formed in a continuous annular shape over the entire circumference of the resonator 10 in the circumferential direction. Although the entirety is not illustrated, FIG. 38 shows an example in which the fourth low thermal conductors 510 are formed in a continuous annular shape over the entire circumference of the resonator 10. In FIG. 38, the base material 11 and the first low thermal conductors 12 are hatched for convenience. On the front surface of the resonator 10, the fourth low thermal conductors 510 including non-through grooves are annularly formed, and the first low thermal conductors 12 are exposed to the inner bottom surfaces of the fourth low thermal conductors 510 (see FIG. 37(A), for example).

The remaining configurations of the eighth embodiment are similar to those of the aforementioned first embodiment.

Advantageous Effects of Eighth Embodiment

According to the eighth embodiment, the following advantageous effects are achieved.

In the angular rate sensor 800 according to the eighth embodiment, similarly to the first embodiment, structural constraints can be reduced while a Q value is increased by the annular first low thermal conductors 12, and overall performance improvement can be achieved.

In the angular rate sensor 800 according to the eighth embodiment, unlike the case in which the fourth low thermal conductors 510 include through-holes, even when the fourth low thermal conductors 510 are annularly formed, the structure in which the resonator 10 is not separated and the inner peripheral sides and the outer peripheral sides of the fourth low thermal conductors 510 are integrally connected can be ensured. Furthermore, in the cross-section of the resonator 10, heat transfer can be significantly reduced or prevented by the grooves at locations at which the fourth low thermal conductors 510 are formed, and the first low thermal conductors 12 are provided in portions in which the fourth low thermal conductors 510 are not formed such that heat transfer can be significantly reduced or prevented. Consequently, the Q value can be more effectively increased.

The remaining advantageous effects of the eighth embodiment are similar to those of the aforementioned first embodiment.

Modified Examples

The embodiments disclosed this time must be considered as illustrative in all points and not restrictive. The scope of the present invention is not shown by the above description of the embodiments but by the scope of claims for patent, and all modifications (modified examples) within the meaning and scope equivalent to the scope of claims for patent are further included.

For example, while an example of the electromagnetically driven angular rate sensor has been shown in each of the aforementioned first to eighth embodiments, the present invention is not restricted to this. The present invention may be applied to an electrostatically driven angular rate sensor or a piezoelectrically driven angular rate sensor.

The configuration of each portion of the angular rate sensor shown in each of the aforementioned first to eighth embodiments can be arbitrarily combined. The present invention includes a configuration in which the configuration of any one of the first to eighth embodiments is combined with the configurations of any one or a plurality of the remaining embodiments.

While the example in which the second low thermal conductors made of the second materials are provided has been shown in the aforementioned second embodiment, the present invention is not restricted to this. Instead of the second low thermal conductors made of the second materials, low thermal conductors made of third materials different from both the first materials and the second materials may be provided. The third materials may be any material having a lower thermal conductivity than the first materials.

While the example in which the end face layers made of the second materials are provided has been shown in the aforementioned third embodiment, the present invention is not restricted to this. Instead of the end face layers made of the second materials, end face layers made of fourth materials different from both the first materials and the second materials may be provided. The fourth materials may be any material having a lower thermal conductivity than the first materials. Similarly, instead of the third low thermal conductors made of the second materials, third low thermal conductors made of fifth materials different from both the first materials and the second materials may be provided. The fifth materials may be any material having a lower thermal conductivity than the first materials.

The method for producing the angular rate sensor shown in each of the aforementioned first and third embodiments is merely an example, and is not limited to the method described above. The angular rate sensor according to the present invention may be produced by any method. Although depending on the size of the angular rate sensor, the method for producing the angular rate sensor is not limited to a method using the semiconductor manufacturing process, but the angular rate sensor may be produced by machining. In other words, the angular rate sensor is not limited to a MEMS sensor, but may be a larger angular rate sensor.

Figure 39:
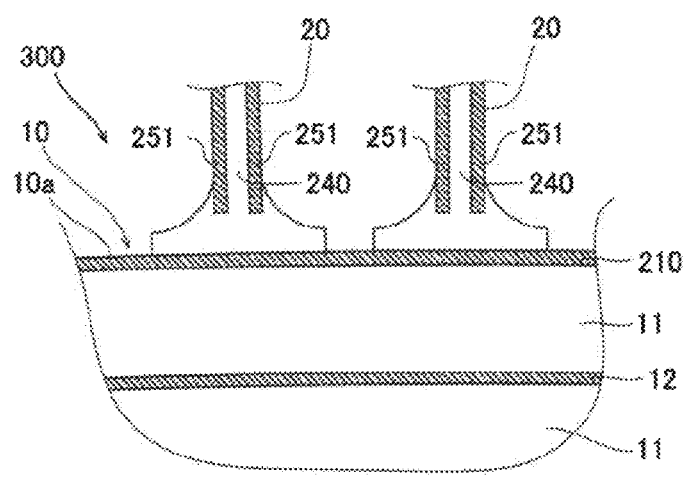
FIG. 39 is an enlarged plan view of the vicinities of couplings showing a first modified example of the third embodiment shown in FIGS. 19A and 19B.

While the example in which the end face layers 210 are provided only on the resonator 10 has been shown in the aforementioned third embodiment (see FIG. 19), the present invention is not restricted to this. As in a first modified example shown in FIG. 39, in addition to an end face layer 210 on a resonator 10, end face layers 251 may be provided on each of supports 20. In FIG. 39, the end face layers 251 including the outer peripheral surfaces (side end faces) on both sides of each of the supports 20 are provided. For the end face layers 251, the same structure and formation method as those for the end face layer 210 can be used. The end face layers 251 are also provided on the supports 20 such that the relative positional accuracy between the supports 20 and the resonator 10 can be improved. In addition, a large tolerance range of a resist in etching through can be ensured by the widths of the end face layers 251.

Furthermore, as for the supports 20, the third low thermal conductors 250 in FIG. 19 and the end face layers 251 in FIG. 39 may be combined. That is, as in a second modified example of FIG. 40, both end face layers 251 including the outer peripheral surfaces on both sides of each of supports 20 and a third low thermal conductor 250 sandwiched between support base materials 240 made of first materials may be provided in each of the supports 20.

Figure 40:
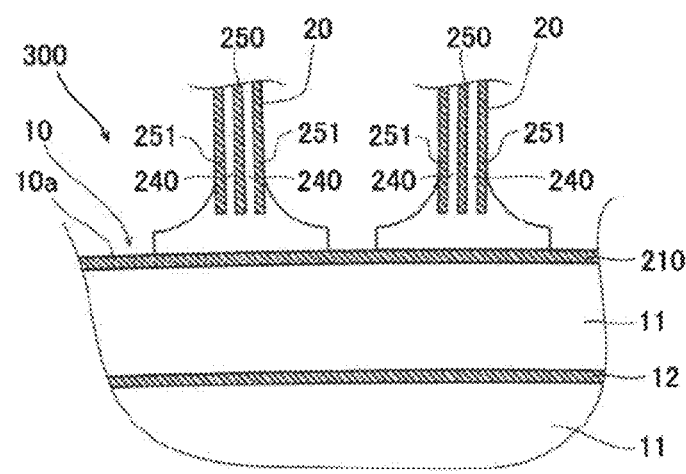
FIG. 40 is an enlarged plan view of the vicinities of couplings showing a second modified example of the third embodiment shown in FIGS. 19A and 19B.
Figure 41:
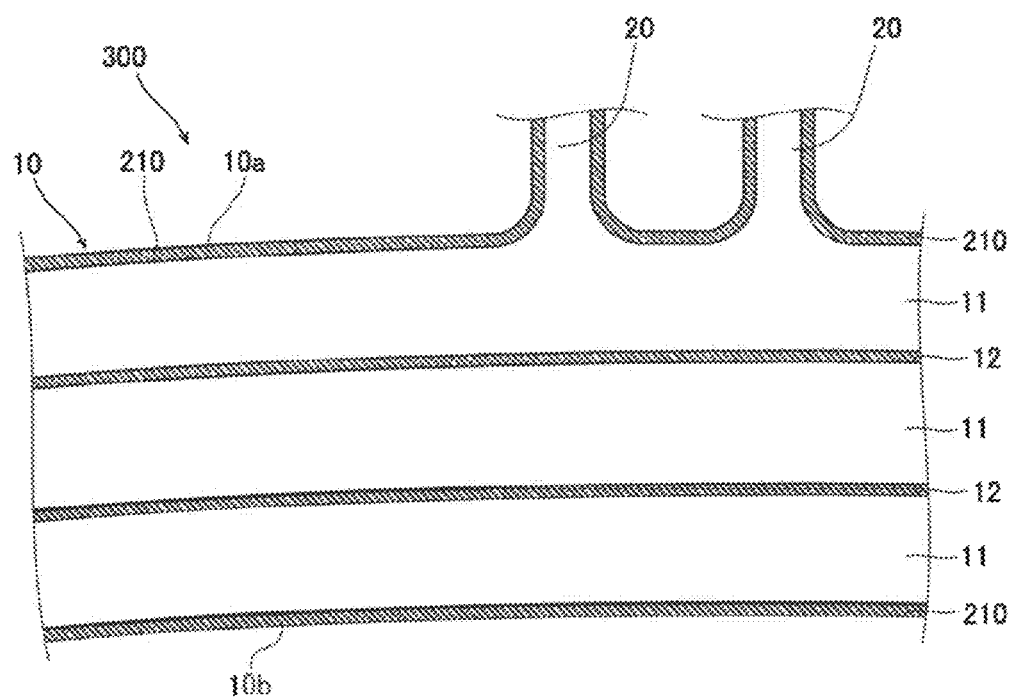
FIG. 41 is an enlarged plan view showing a resonator according to a third modified example of the third embodiment shown in FIGS. 19A and 19B.

In the examples of FIGS. 39 and 40, the end face layer 210 of the resonator 10 and the end face layers 251 of the supports 20 are provided as separate structures, but may be integrally formed so as to be continuous with each other. That is, as in a third modified example shown in FIG. 41, an end face layer 210 continuous with a resonator 10 and supports 20 may be provided so as to define the outer shapes of both the resonator 10 and the supports 20. In this case, the end face layer 210 may be formed not only on the outer peripheral surface 10a of the resonator 10 and the outer peripheral surfaces of the supports 20 but also on the inner peripheral surface (not shown) of a fixed portion 30. That is, when a through-hole that defines the resonator 10, the supports 20, and the fixed portion 30 is formed in a substrate 1 by etching through, the end face layer 210 may be formed along the entire contour (edge, end face) of the through-hole. In this case, the overall positional accuracy of the resonator 10, the supports 20, and the fixed portion 30 can be improved.

DESCRIPTION OF REFERENCE NUMERALS

10: resonator
10a: outer peripheral surface
10b: inner peripheral surface
11: base material
12, 12a, 12b: first low thermal conductor
20: support
30: fixed portion
40: wiring
100, 200, 300, 400, 500, 600, 700, 800: angular rate sensor
110, 110a, 110b: second low thermal conductor
210: end face layer
240: support base material
250: third low thermal conductor
310: break
410: conductive layer
510, 510a, 510b: fourth low thermal conductor
CP: coupling
R1: first region
R2: second region

The invention claimed is:
1. An angular rate sensor comprising:
an annular resonator; and
a support that connects the resonator to a fixed portion and supports the resonator; wherein the resonator includes:

an annular base material made of a first material;
an annular first low thermal conductor made of a second material having a lower thermal conductivity than the first material, the first low thermal conductor being sandwiched between an annular first region and an annular second region on an inner side of the first region in the base material over substantially an entire circumference of the resonator, and
an insulating film provided on the first low thermal conductor,
wherein the insulating film is made of the second material and formed integrally with the first low thermal conductor,
wherein the first low thermal conductor includes a break in a part of the first low thermal conductor in a circumferential direction of the resonator,
wherein the base material on an inner peripheral side of the first low thermal conductor and the base material on an outer peripheral side of the first low thermal conductor are electrically connected to each other via the first material arranged in the break,
wherein the first low thermal conductor includes a plurality of first low thermal conductors provided in a radial direction of the resonator, and
wherein the break of each of the plurality of first low thermal conductors is formed, in the circumferential direction, at positions of nodes that are different from each another in a primary vibration mode in which the resonator is driven.

2. The angular rate sensor according to claim 1, wherein the first low thermal conductor includes a plurality of first low thermal conductors provided in a radial direction of the resonator.

3. The angular rate sensor according to claim 1, wherein the first low thermal conductor is formed through substantially an entire thickness of the resonator.

4. The angular rate sensor according to claim 1, wherein the first low thermal conductor penetrates the base material in a thickness direction of the resonator and is continuous over the entire circumference of the resonator in a circumferential direction so as to divide the base material.

5. The angular rate sensor according to claim 1, further comprising a second low thermal conductor made of the second material and provided at a coupling between the resonator and the support.

6. The angular rate sensor according to claim 1, wherein a surface of the first low thermal conductor is substantially flush with a surface of the base material; and
the resonator includes wiring that crosses over the first low thermal conductor.

7. The angular rate sensor according to claim 1, wherein the first material is silicon; and
the second material is a silicon oxide.

8. The angular rate sensor according to claim 1, wherein at least one of an outer peripheral surface or an inner peripheral surface of the resonator includes an end face layer made of the second material.

9. The angular rate sensor according to claim 1, wherein the first low thermal conductor includes a plurality of first low thermal conductors provided in a radial direction of the resonator; and
formation positions of respective breaks of the plurality of first low thermal conductors are different from each other in the circumferential direction.

10. The angular rate sensor according to claim 1, wherein the first low thermal conductor is provided continuously over the entire circumference of the resonator so as to divide the base material;
the base material on an inner peripheral side of the first low thermal conductor and the base material on an outer peripheral side of the first low thermal conductor are electrically separated from each other; and
the resonator includes, on a front side or a back side of the resonator with respect to the first low thermal conductor and the base material, a conductive layer that conducts electricity to the base material that has been divided.

11. An angular rate sensor, comprising:
an annular resonator; and
a support that connects the resonator to a fixed portion and supports the resonator; wherein the resonator includes:
an annular base material made of a first material;
an annular first low thermal conductor made of a second material having a lower thermal conductivity than the first material, the first low thermal conductor being sandwiched between an annular first region and an annular second region on an inner side of the first region in the base material over substantially an entire circumference of the resonator, and
an insulating film provided on the first low thermal conductor,
wherein the insulating film is made of the second material and formed integrally with the first low thermal conductor,
wherein the first low thermal conductor includes a break in a part of the first low thermal conductor in a circumferential direction of the resonator,
wherein the base material on an inner peripheral side of the first low thermal conductor and the base material on an outer peripheral side of the first low thermal conductor are electrically connected to each other via the first material arranged in the break,
wherein the break of first low thermal conductor is formed, in the circumferential direction, at positions of nodes in a primary vibration mode in which the resonator is driven, and
wherein the support includes support base materials each made of the first material, and a support low thermal conductor made of the second material and sandwiched between the support base materials from both sides in a width direction of the support.

12. The angular rate sensor according to claim 1, wherein the resonator has a low thermal conduction opening portion including a non-through groove or a through-hole formed in the resonator.

13. The angular rate sensor according to claim 12, wherein the low thermal conduction opening portion and the first low thermal conductor are arranged in a radial direction of the resonator.

14. The angular rate sensor according to claim 12, wherein the low thermal conduction opening portion and the first low thermal conductor are arranged in a circumferential direction of the resonator.

15. The angular rate sensor according to claim 14, wherein
the low thermal conduction opening portion includes a plurality of low thermal conduction opening portion aligned over substantially the entire circumference of the resonator; and
the first low thermal conductor is provided between the low thermal conduction opening portion in the circumferential direction.

16. The angular rate sensor according to claim 12, wherein
- the low thermal conduction opening portion includes a groove having a concave shape in a thickness direction of the resonator; and
- the low thermal conduction opening portion and the first low thermal conductor are arranged in the thickness direction.

17. The angular rate sensor according to claim 1, further comprising:
- a wiring provided on the resonator, and on the first low thermal conductor,
- wherein the wiring is provided on the insulating film.

* * * * *